(12) United States Patent
Kashiwagi et al.

(10) Patent No.: US 9,835,659 B2
(45) Date of Patent: Dec. 5, 2017

(54) POWER DISTRIBUTION MANAGEMENT METHOD, VOLTAGE DETERMINATION METHOD, AND RECORDING MEDIUM FOR DETERMINING TRANSMISSION VOLTAGE OF SUBSTATION

(71) Applicant: FUJITSU LIMITED, Kawasaki-shi, Kanagawa (JP)

(72) Inventors: Tetsuya Kashiwagi, Fukuoka (JP); Yuichi Matsufuji, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 298 days.

(21) Appl. No.: 14/672,449

(22) Filed: Mar. 30, 2015

(65) Prior Publication Data
US 2015/0204921 A1    Jul. 23, 2015

Related U.S. Application Data

(63) Continuation of application No. PCT/JP2012/075438, filed on Oct. 1, 2012.

(51) Int. Cl.
G01R 19/25 (2006.01)
G01R 19/00 (2006.01)
H02J 3/00 (2006.01)
H02J 13/00 (2006.01)
H02J 3/38 (2006.01)

(52) U.S. Cl.
CPC ..... G01R 19/2513 (2013.01); G01R 19/0084 (2013.01); G01R 19/2506 (2013.01);
(Continued)

(58) Field of Classification Search
CPC ............ G01R 19/2513; G01R 19/0084; G01R 19/2516; G01R 19/2506; H02J 13/0006;
(Continued)

(56) References Cited

U.S. PATENT DOCUMENTS

2012/0299383 A1* 11/2012 Cyuzawa ................ H02J 3/381
307/75
2012/0313432 A1* 12/2012 Wakabayashi .......... H02J 3/382
307/24

FOREIGN PATENT DOCUMENTS

JP    2007-82346 A    3/2007
JP    2008-118799 A   5/2008
(Continued)

OTHER PUBLICATIONS

Machine English Translation of JP 2010-233352 published Oct. 14, 2010.*
(Continued)

Primary Examiner — Billy Lactaoen
(74) Attorney, Agent, or Firm — Fujitsu Patent Center

(57) ABSTRACT

A power distribution management apparatus (10) includes acquiring the amount of demand obtained by forecasting the amount of power to be used by load equipment of a customer, and the amount of power generation obtained by forecasting the amount of power to be generated by power generation equipment of the customer, and setting a plurality of voltage values as a plurality of candidates for a transmission voltage from a substation of a power distribution system, and calculating a voltage at a connection point of the load equipment of the customer and equipment of the power distribution system at each of the plurality of candidates by utilizing a difference between the demand amount and the power generation amount of each customer, and determining the transmission voltage of the substation from the plurality of candidates based on a result of the calculating.

3 Claims, 18 Drawing Sheets

(52) U.S. Cl.
CPC ............ *G01R 19/2516* (2013.01); *H02J 3/00* (2013.01); *H02J 13/0006* (2013.01); *H02J 3/381* (2013.01); *H02J 2003/003* (2013.01); *H02J 2003/007* (2013.01); *Y02E 40/72* (2013.01); *Y02E 60/76* (2013.01); *Y04S 10/12* (2013.01); *Y04S 10/54* (2013.01); *Y04S 40/22* (2013.01)

(58) Field of Classification Search
CPC ........ H02J 3/00; H02J 3/381; H02J 2003/007; H02J 2003/003; Y04S 10/12; Y04S 40/22; Y04S 10/54; Y02E 40/72; Y02E 60/76
USPC .......................................................... 324/72
See application file for complete search history.

(56) References Cited

FOREIGN PATENT DOCUMENTS

| | | |
|---|---|---|
| JP | 2008-228428 A | 9/2008 |
| JP | 2009-065817 A | 3/2009 |
| JP | 2010-233352 A | 10/2010 |
| JP | 2011-36091 A | 2/2011 |
| JP | 2012-95464 A | 5/2012 |
| JP | 2012-124188 A | 6/2012 |
| JP | 2012-147578 A | 8/2012 |
| WO | 2012-114582 A1 | 8/2012 |

OTHER PUBLICATIONS

International Search Report, mailed in connection with PCT/JP2012/075438 and dated Jun. 11, 2013 (9 pages).

Extended European Search Report dated Nov. 3, 2015 for corresponding European Patent Application No. 12885955, 5 pages.

Japanese Office Action dated Nov. 17, 2015 for corresponding Japanese Patent Application No. 2014-539504, with Partial English Translation, 3 pages.

* cited by examiner

FIG.4

| POSITION ID | POSITION TYPE | LATITUDE | LONGITUDE |
|---|---|---|---|
| SS0001 | SS | 502723016 | 128084866 |
| PO0001 | POLE | 502723021 | 128084176 |
| PO0002 | POLE | 502723031 | 128083227 |
| PO0003 | POLE | 502724066 | 128083262 |
| PO0004 | POLE | 502725091 | 128083296 |
| PO0005 | POLE | 502726033 | 128083331 |
| PO0006 | POLE | 502726840 | 128083382 |
| PO0007 | POLE | 502727844 | 128083430 |
| PO0008 | POLE | 502728620 | 128083503 |
| LL0001 | LOADL | 502728677 | 128083736 |
| PO0009 | POLE | 502729231 | 128083641 |
| PO0010 | POLE | 502729304 | 128084383 |
| PO0011 | POLE | 502729179 | 128084814 |
| LL0002 | LOADL | 502729402 | 128085012 |
| PO0012 | POLE | 502728879 | 128085361 |
| PO0013 | POLE | 502728620 | 128085900 |
| LL0003 | LOADL | 502729298 | 128086064 |
| LL0004 | LOADL | 502729174 | 128086288 |
| LL0005 | LOADL | 502729133 | 128085547 |
| PO0014 | POLE | 502725019 | 128082520 |
| LL0006 | LOADL | 502724661 | 128082339 |
| PO0015 | POLE | 502725112 | 128081757 |
| PO0016 | POLE | 502725122 | 128081244 |
| LL0007 | LOADL | 502724765 | 128081321 |
| LL0008 | LOADL | 502724744 | 128081718 |

FIG.5

| EQUIPMENT ID | POSITION ID | TYPE | ATTRIBUTE INFORMATION |
|---|---|---|---|
| PO0001 P1 | PO0001 | POLE | ... |
| PO0001 01 | PO0001 | SW | ... |
| PO0002 P1 | PO0002 | POLE | ... |
| PO0003 P1 | PO0003 | POLE | ... |
| PO0004 P1 | PO0004 | POLE | ... |
| PO0004 01 | PO0004 | SW | ... |
| PO0005 P1 | PO0005 | POLE | ... |
| PO0006 P1 | PO0006 | POLE | ... |
| PO0007 P1 | PO0007 | POLE | ... |
| PO0007 01 | PO0007 | BANK | RESISTANCE (36800 $\Omega$), REACTANCE (31300 $\Omega$), VOLTAGE RATIO 1 |
| PO0008 P1 | PO0008 | POLE | ... |
| LL0001 01 | LL0001 | LOADL | ... |
| PO0009 P1 | PO0009 | POLE | ... |
| PO0009 01 | PO0009 | SW | ... |
| PO0010 P1 | PO0010 | POLE | ... |
| PO0011 P1 | PO0011 | POLE | ... |
| LL0002 01 | LL0002 | LOADL | ... |
| PO0012 P1 | PO0012 | POLE | ... |
| PO0012 01 | PO0012 | BANK | RESISTANCE (36800 $\Omega$), REACTANCE (31300 $\Omega$), VOLTAGE RATIO 2 |
| PO0013 P1 | PO0013 | POLE | ... |
| LL0003 01 | LL0003 | LOADL | ... |
| LL0004 01 | LL0004 | LOADL | ... |
| LL0005 01 | LL0005 | LOADL | ... |
| PO0014 P1 | PO0014 | POLE | ... |
| LL0006 01 | LL0006 | LOADL | ... |
| PO0015 P1 | PO0015 | POLE | ... |
| PO0015 01 | PO0015 | BANK | RESISTANCE (36800 $\Omega$), REACTANCE (31300 $\Omega$), VOLTAGE RATIO 3 |
| PO0016 P1 | PO0016 | POLE | ... |
| LL0007 01 | LL0007 | LOADL | ... |
| LL0008 01 | LL0008 | LOADL | ... |

FIG.6

| EQUIPMENT ID | POSITION ID$_1$ | POSITION ID$_2$ | TYPE | ATTRIBUTE INFORMATION ||| 
|---|---|---|---|---|---|---|
| | | | | SPAN | RESISTANCE (R) | REACTANCE (X) |
| SP0001 | SS0001 | PO0001 | 3H | 21 | 220 | 150 |
| SP0002 | PO0001 | PO0002 | 3H | 29 | 220 | 150 |
| SP0003 | PO0002 | PO0003 | 3H | 32 | 220 | 150 |
| SP0004 | PO0003 | PO0004 | 3H | 32 | 220 | 150 |
| SP0005 | PO0004 | PO0005 | 3H | 29 | 220 | 150 |
| SP0006 | PO0005 | PO0006 | 3H | 25 | 220 | 150 |
| SP0007 | PO0006 | PO0007 | 3H | 31 | 220 | 150 |
| SP0008 | PO0007 | PO0008 | 3H | 24 | 220 | 150 |
| SP0009 | PO0007 | PO0008 | 3L | 24 | 390 | 240 |
| SP0010 | PO0008 | LL0001 | | 7 | 510 | 820 |
| SP0011 | PO0008 | PO0009 | 3H | 19 | 220 | 150 |
| SP0012 | PO0009 | PO0010 | 3H | 23 | 220 | 150 |
| SP0013 | PO0010 | PO0011 | 3H | 14 | 220 | 150 |
| SP0014 | PO0012 | PO0011 | 3L | 19 | 390 | 240 |
| SP0015 | PO0011 | LL0002 | | 9 | 510 | 820 |
| SP0016 | PO0011 | PO0012 | 3H | 19 | 220 | 150 |
| SP0017 | PO0012 | PO0013 | 3L | 18 | 390 | 240 |
| SP0018 | PO0013 | LL0003 | | 22 | 510 | 820 |
| SP0019 | PO0013 | LL0004 | | 21 | 510 | 820 |
| SP0020 | PO0012 | LL0005 | | 10 | 510 | 820 |
| SP0021 | PO0004 | PO0014 | 3H | 24 | 220 | 150 |
| SP0022 | PO0015 | PO0014 | 3L | 24 | 390 | 240 |
| SP0023 | PO0014 | LL0006 | | 12 | 510 | 820 |
| SP0024 | PO0014 | PO0015 | 3H | 24 | 220 | 150 |
| SP0025 | PO0015 | PO0016 | 3L | 16 | 390 | 240 |
| SP0026 | PO0016 | LL0007 | | 11 | 510 | 820 |
| SP0027 | PO0015 | LL0008 | | 11 | 510 | 820 |

| NODE ID | POSITION ID |
|---|---|
| SS0001 N01 | SS0001 |
| PO0001 N01 | PO0001 |
| PO0001 N02 | PO0001 |
| PO0002 N01 | PO0002 |
| PO0003 N01 | PO0003 |
| PO0004 N01 | PO0004 |
| PO0004 N02 | PO0004 |
| PO0005 N01 | PO0005 |
| PO0006 N01 | PO0006 |
| PO0007 N01 | PO0007 |
| PO0007 N02 | PO0007 |
| PO0008 N01 | PO0008 |
| PO0008 N02 | PO0008 |
| LL0001 N01 | LL0001 |
| PO0009 N01 | PO0009 |
| PO0009 N02 | PO0009 |
| PO0010 N01 | PO0010 |
| PO0011 N01 | PO0011 |
| PO0011 N02 | PO0011 |
| LL0002 N01 | LL0002 |
| PO0012 N01 | PO0012 |
| PO0012 N02 | PO0012 |
| PO0013 N01 | PO0013 |
| LL0003 N01 | LL0003 |
| LL0004 N01 | LL0004 |
| LL0005 N01 | LL0005 |
| PO0014 N01 | PO0014 |
| PO0014 N02 | PO0014 |
| LL0006 N01 | LL0006 |
| PO0015 N01 | PO0015 |
| PO0015 N02 | PO0015 |
| PO0016 N01 | PO0016 |
| LL0007 N01 | LL0007 |
| LL0008 N01 | LL0008 |

FIG.8

| BRANCH ID | NODE ID₁ | NODE ID₂ | EQUIPMENT ID | OPEN/CLOSED DIVISION |
|---|---|---|---|---|
| BR0001 | SS0001 N01 | PO0001 N01 | SP0001 | |
| BR0002 | PO0001 N01 | PO0001 N02 | PO0001 01 | 1 |
| BR0003 | PO0001 N02 | PO0002 N01 | SP0002 | |
| BR0004 | PO0002 N01 | PO0003 N01 | SP0003 | |
| BR0005 | PO0003 N01 | PO0004 N01 | SP0004 | |
| BR0006 | PO0004 N01 | PO0004 N02 | PO0004 01 | 1 |
| BR0007 | PO0004 N02 | PO0005 N01 | SP0005 | |
| BR0008 | PO0005 N01 | PO0006 N01 | SP0006 | |
| BR0009 | PO0006 N01 | PO0007 N01 | SP0007 | |
| BR0010 | PO0007 N01 | PO0007 N02 | PO0007 01 | |
| BR0011 | PO0007 N01 | PO0008 N01 | SP0008 | |
| BR0012 | PO0007 N02 | PO0008 N02 | SP0009 | |
| BR0013 | PO0008 N02 | LL0001 N01 | SP0010 | |
| BR0014 | LL0001 N01 | | LL0001 01 | |
| BR0018 | PO0008 N01 | PO0009 N01 | SP0011 | |
| BR0019 | PO0009 N01 | PO0009 N02 | PO0009 01 | 1 |
| BR0020 | PO0009 N02 | PO0010 N01 | SP0012 | |
| BR0021 | PO0010 N01 | PO0011 N01 | SP0013 | |
| BR0022 | PO0012 N02 | PO0011 N02 | SP0014 | |
| BR0023 | PO0011 N02 | LL0002 N01 | SP0015 | |
| BR0024 | LL0002 N01 | | LL0002 01 | |
| BR0028 | PO0011 N01 | PO0012 N01 | SP0016 | |
| BR0029 | PO0012 N01 | PO0012 N02 | PO0012 01 | |
| BR0030 | PO0012 N02 | PO0013 N01 | SP0017 | |
| BR0031 | PO0013 N01 | LL0003 N01 | SP0018 | |
| BR0032 | LL0003 N01 | | LL0003 01 | |
| BR0036 | PO0013 N01 | LL0004 N01 | SP0019 | |
| BR0037 | LL0004 N01 | | LL0004 01 | |
| BR0041 | PO0012 N02 | LL0005 N01 | SP0020 | |
| BR0042 | LL0005 N01 | | LL0005 01 | |
| BR0046 | PO0004 N01 | PO0014 N01 | SP0021 | |
| BR0047 | PO0015 N02 | PO0014 N02 | SP0022 | |
| BR0048 | PO0014 N02 | LL0006 N01 | SP0023 | |
| BR0049 | LL0006 N01 | | LL0006 01 | |
| BR0053 | PO0014 N01 | PO0015 N01 | SP0024 | |
| BR0054 | PO0015 N01 | PO0015 N02 | PO0015 01 | |
| BR0055 | PO0015 N02 | PO0016 N01 | SP0025 | |
| BR0056 | PO0016 N01 | LL0007 N01 | SP0026 | |
| BR0057 | LL0007 N01 | | LL0007 01 | |
| BR0061 | PO0015 N02 | LL0008 N01 | SP0027 | |
| BR0062 | LL0008 N01 | | LL0008 01 | |

FIG.9

| CONNECTION ID | POSITION ID | AMOUNT OF POWER USAGE (ACTIVE) | AMOUNT OF POWER USAGE (REACTIVE) |
|---|---|---|---|
| SS0001 N01 | SS0001 | | |
| PO0001 N01 | PO0001 | | |
| PO0001 N02 | PO0001 | | |
| PO0002 N01 | PO0002 | | |
| PO0003 N01 | PO0003 | | |
| PO0004 N01 | PO0004 | | |
| PO0004 N02 | PO0004 | | |
| PO0005 N01 | PO0005 | | |
| PO0006 N01 | PO0006 | | |
| PO0007 N01 | PO0007 | | |
| PO0007 N02 | PO0007 | | |
| PO0008 N01 | PO0008 | | |
| PO0008 N02 | PO0008 | | |
| LL0001 N01 | LL0001 | 200 | 20 |
| PO0009 N01 | PO0009 | | |
| PO0009 N02 | PO0009 | | |
| PO0010 N01 | PO0010 | | |
| PO0011 N01 | PO0011 | | |
| PO0011 N02 | PO0011 | | |
| LL0002 N01 | LL0002 | 220 | 22 |
| PO0012 N01 | PO0012 | | |
| PO0012 N02 | PO0012 | | |
| PO0013 N01 | PO0013 | | |
| LL0003 N01 | LL0003 | 180 | 18 |
| LL0004 N01 | LL0004 | 240 | 24 |
| LL0005 N01 | LL0005 | 210 | 21 |
| PO0014 N01 | PO0014 | | |
| PO0014 N02 | PO0014 | | |
| LL0006 N01 | LL0006 | 300 | 30 |
| PO0015 N01 | PO0015 | | |
| PO0015 N02 | PO0015 | | |
| PO0016 N01 | PO0016 | | |
| LL0007 N01 | LL0007 | 240 | 24 |
| LL0008 N01 | LL0008 | 230 | 23 |

| BRANCH ID | NODE ID₁ | NODE ID₂ | EQUIPMENT ID | OPEN/ CLOSED DIVISION | REACTANCE (X) | RESISTANCE (R) |
|---|---|---|---|---|---|---|
| BR0001 | SS0001 N01 | PO0001 N01 | SP0001 | | 3150 | 4620 |
| BR0002 | PO0001 N01 | PO0001 N02 | PO0001 01 | 1 | 0 | 0 |
| BR0003 | PO0001 N02 | PO0002 N01 | SP0002 | | 4350 | 6380 |
| BR0004 | PO0002 N01 | PO0003 N01 | SP0003 | | 4800 | 7040 |
| BR0005 | PO0003 N01 | PO0004 N01 | SP0004 | | 4800 | 7040 |
| BR0006 | PO0004 N01 | PO0004 N02 | PO0004 01 | 1 | 0 | 0 |
| BR0007 | PO0004 N02 | PO0005 N01 | SP0005 | | 4350 | 6380 |
| BR0008 | PO0005 N01 | PO0006 N01 | SP0006 | | 3750 | 5500 |
| BR0009 | PO0006 N01 | PO0007 N01 | SP0007 | | 4650 | 6820 |
| BR0010 | PO0007 N01 | PO0007 N02 | PO0007 01 | | 31300 | 36800 |
| BR0011 | PO0007 N01 | PO0008 N01 | SP0008 | | 3600 | 5280 |
| BR0012 | PO0007 N02 | PO0008 N02 | SP0009 | | 5760 | 9360 |
| BR0013 | PO0008 N02 | LL0001 N01 | SP0010 | | 5740 | 3570 |
| BR0014 | LL0001 N01 | | LL0001 01 | | 0 | 0 |
| BR0018 | PO0008 N01 | PO0009 N01 | SP0011 | | 2850 | 4180 |
| BR0019 | PO0009 N01 | PO0009 N02 | PO0009 01 | 1 | 0 | 0 |
| BR0020 | PO0009 N02 | PO0010 N01 | SP0012 | | 3450 | 5060 |
| BR0021 | PO0010 N01 | PO0011 N01 | SP0013 | | 2100 | 3080 |
| BR0022 | PO0012 N02 | PO0011 N02 | SP0014 | | 4560 | 7410 |
| BR0023 | PO0011 N02 | LL0002 N01 | SP0015 | | 7380 | 4590 |
| BR0024 | LL0002 N01 | | LL0002 01 | | 0 | 0 |
| BR0028 | PO0011 N01 | PO0012 N01 | SP0016 | | 2850 | 4180 |
| BR0029 | PO0012 N01 | PO0012 N02 | PO0012 01 | | 31300 | 36800 |
| BR0030 | PO0012 N02 | PO0013 N01 | SP0017 | | 4320 | 7020 |
| BR0031 | PO0013 N01 | LL0003 N01 | SP0018 | | 18040 | 11220 |
| BR0032 | LL0003 N01 | | LL0003 01 | | 0 | 0 |
| BR0036 | PO0013 N01 | LL0004 N01 | SP0019 | | 17220 | 10710 |
| BR0037 | LL0004 N01 | | LL0004 01 | | 0 | 0 |
| BR0041 | PO0012 N02 | LL0005 N01 | SP0020 | | 8200 | 5100 |
| BR0042 | LL0005 N01 | | LL0005 01 | | 0 | 0 |
| BR0046 | PO0004 N01 | PO0014 N01 | SP0021 | | 3600 | 5280 |
| BR0047 | PO0015 N02 | PO0014 N02 | SP0022 | | 5760 | 9360 |
| BR0048 | PO0014 N02 | LL0006 N01 | SP0023 | | 9840 | 6120 |
| BR0049 | LL0006 N01 | | LL0006 01 | | 0 | 0 |
| BR0053 | PO0014 N01 | PO0015 N01 | SP0024 | | 3600 | 5280 |
| BR0054 | PO0015 N01 | PO0015 N02 | PO0015 01 | | 31300 | 36800 |
| BR0055 | PO0015 N02 | PO0016 N01 | SP0025 | | 3840 | 6240 |
| BR0056 | PO0016 N01 | LL0007 N01 | SP0026 | | 9020 | 5610 |
| BR0057 | LL0007 N01 | | LL0007 01 | | 0 | 0 |
| BR0061 | PO0015 N02 | LL0008 N01 | SP0027 | | 9020 | 5610 |
| BR0062 | LL0008 N01 | | LL0008 01 | | 0 | 0 |

FIG.13

| TIME | VOLTAGE |
|---|---|
| 9:00 | 6900 |
| 10:00 | 6750 |
| 11:00 | 6750 |
| 12:00 | 6450 |
| 13:00 | 6450 |
| 14:00 | 6450 |
| 15:00 | 6600 |
| 16:00 | 6600 |
| 17:00 | 6750 |
| ... | ... |

POWER DISTRIBUTION MANAGEMENT METHOD, VOLTAGE DETERMINATION METHOD, AND RECORDING MEDIUM FOR DETERMINING TRANSMISSION VOLTAGE OF SUBSTATION

CROSS-REFERENCE TO RELATED APPLICATION

This application is a continuation application of International Application PCT/JP2012/075438 filed on Oct. 1, 2012 and designating the U.S. the entire contents of which are incorporated herein, by reference.

FIELD

The embodiments discussed herein are directed to a power distribution management method, a voltage determination method, and a voltage determination program.

BACKGROUND

A power distribution system includes a high voltage line used for power distribution of high voltage power, and a low voltage line used for power distribution of low voltage power. A standard voltage and a tolerance range within which a deviation from the standard voltage is allowed are established for these high voltage line and low voltage line. Hence, voltage drop is calculated dividing the power distribution system from a substation to load equipment into a high voltage system including equipment such as the high voltage line and a switch, and a low voltage system including equipment such as the low voltage line and a service drop. After that, the voltage of electric power to be transmitted from the substation is set in such a manner as that the voltage before and after the voltage, drop falls within the tolerance range in the high voltage system and the low voltage system.

Patent Literature 1: Japanese Laid-open Patent Publication No. 2008-118799

Patent Literature 2 Japanese Laid-open Patent Publication No. 2011-036091

However, a reverse flow due to a distributed energy resource or the like is not expected in the above technology. Therefore, the power beyond the tolerance range of voltage may fail to be prevented from flowing in the power distribution system.

In other words, the distributed energy resource is installed at a customer's premises in some cases with the spread of the distributed energy resources such as solar power generation. In this case, a reverse flow may occur from the distributed energy resource installed at the customer's premises to the power distribution system of an electric utility. If power flows in two ways between the substation and the load equipment, the change of power at each piece of equipment included in the low voltage system may be increased by the reverse flow. For example, even if the voltage is within the tolerance range at the point of occurrence of the reverse flow, when the reverse flow stops occurring, power is distributed to the load equipment and used there. Accordingly, the voltage may be reduced beyond the tolerance range in the power distribution system. Even if the voltage of power to be transmitted from the substation is set ignoring such a reverse flow, it is not possible to prevent the bower beyond the tolerance range of voltage from flowing in the power distribution system.

SUMMARY

According to an aspect of the embodiment of the invention, a power distribution management apparatus includes a processor. The processor executes a process including: acquiring the amount of demand obtained by forecasting the amount of power to be used by load equipment of a customer, and the amount of power generation obtained by forecasting the amount of power to be generated by power generation equipment of the customer; setting a plurality of voltage values as a plurality of candidates for a transmission voltage from a substation of a power distribution system, and calculating a voltage at a connection point of the load equipment of the customer and equipment of the power distribution system at each of the plurality of candidates by utilizing a difference between the demand amount and the power generation amount of each customer; and determining the transmission voltage of the substation from the plurality of candidates based on a result of the calculating.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram illustrating an example of a "location" table.

FIG. 5 is a diagram illustrating an example of "unit" table.

FIG. 6 is a diagram illustrating an example of a "span" table.

FIG. 7 is a diagram illustrating an example of a node table.

FIG. 8 is a diagram illustrating an example of a "branch" table.

FIG. 9 is a diagram illustrating en example of a current node table.

FIG. 10 is a diagram illustrating an example of a current "branch" table.

FIG. 13 is a diagram illustrating an example of a schedule table.

DESCRIPTION OF EMBODIMENTS

A power distribution management apparatus, a voltage determination method, and a voltage determination program according to the present application are hereinafter described with reference to the accompanying drawings. Embodiments thereof do not limit the technology of the present disclosure. The embodiments can be combined within, the scope that does not contradict processing contents, as appropriate.

First Embodiment

[Configuration of Power Distribution. Management Apparatus]

Figure 1:
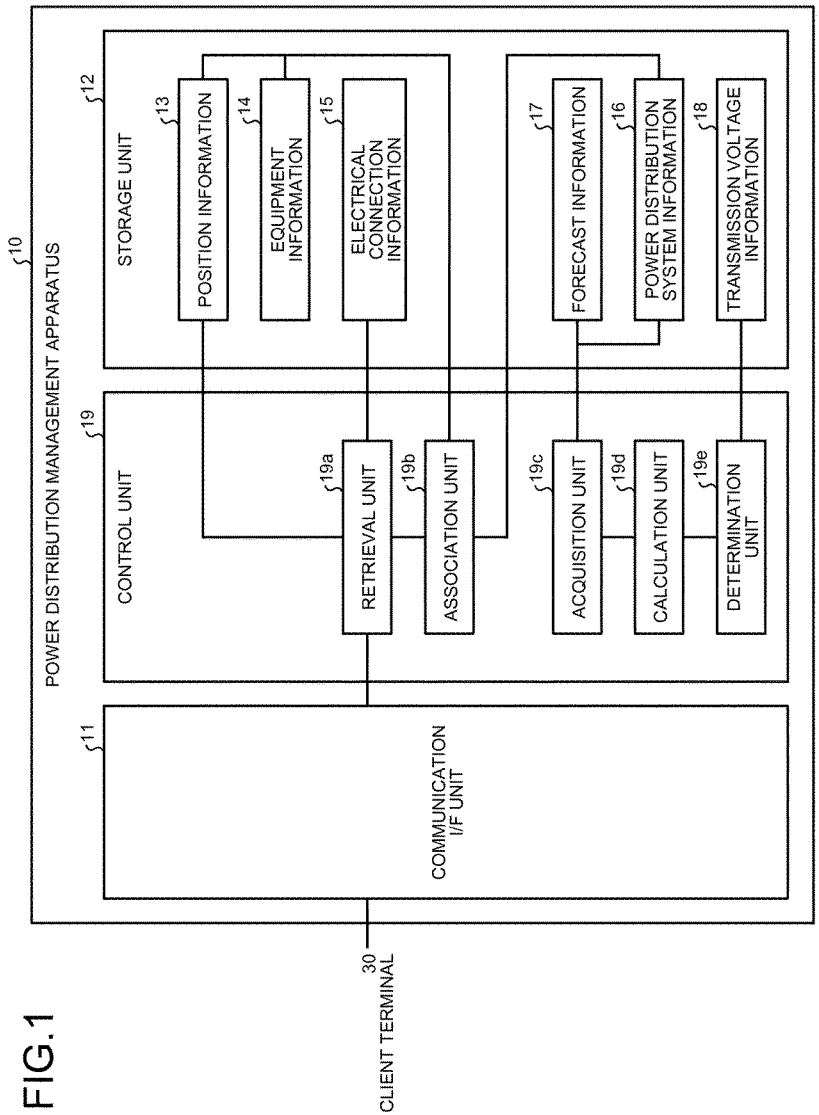
FIG. 1 is a block diagram illustrating the functional configuration of a power distribution management apparatus according to a first embodiment.

FIG. 1 is a block diagram illustrating the functional configuration of a power distribution management apparatus according to a first embodiment. A power distribution management apparatus 10 illustrated in FIG. 1 executes a voltage determination process that determines a voltage to be transmitted from a substation, of a power distribution system, what is called a transmission voltage. In the embodiment, the following description is given assuming a case in which a transmission voltage per time slot obtained by sectioning one day hourly is determined.

An aspect of such a power distribution management apparatus 10 may be implemented as a Web server that executes the above voltage determination process, or can also be implemented as a cloud that provides service related to the above voltage determination process by outsourcing. As another aspect, it can also be implemented by preinstalling or installing a voltage determination program provided as packaged software or online software in a desired computer.

As illustrated in FIG. 1, the power distribution management apparatus 10 is connected in such a manner as to be able to communicate with another apparatus such as a client terminal 30 via a predetermined network. Any kind of communication network such as the Internet (Internet), a LAN (Local Area Network), or VPN (Virtual Private Network) can be adopted as such a network, irrespective of wired or wireless. The power distribution management apparatus 10 can accommodate any given number of client terminals 30.

Of them, the client terminal 30 is a terminal apparatus on a side that receives the provision of the above voltage determination service. As examples of such a client terminal 30, mobile terminals such as mobile phones, PHSs (Personal Handyphone System) and PDAs (Personal Digital Assistant), in addition to fixed terminals including personal computers (PC: personal computers), can also be adopted. The client terminal 30 is used by staff from the electric utility, for example, a person in charge and manager of a power distribution department.

As illustrated in FIG. 1, the power distribution management apparatus 10 includes a communication I/F (interface) unit 11, a storage unit 12, and a control unit 19. The power distribution management apparatus 10 may include various functional units included in a known computer, for example, functional units such as various input/output devices and imaging devices, other than the functional units illustrated in FIG. 1.

The communication I/F unit 11 is an interface that controls communication with another apparatus, for example, the client terminal 30. As an aspect of such a communication I/F unit 11, a network interface card such as a LAN card can be adopted. For example, the communication I/F unit 11 receives, from the client terminal 30, a request to determine the transmission voltage of a substation, or notifies a determination result of the transmission voltage of the substation from the power distribution management apparatus 10 to the client terminal 30.

The storage unit 12 is a storage device that stores an OS (Operating System) and various programs such as the voltage determination program, which are executed by the control unit 19. Aspects of the storage unit 12 include storage devices such as semiconductor memory devices, for example, flash memories, hard disks, and optical discs. The storage unit 12 is not limited to the above types of storage devices, but may be RAM (Random Access Memory), or ROM (Read Only Memory).

The storage unit 12 stores position information 13, equipment information 14, electrical connection information 15, power distribution, system information 15, forecast information 17, and transmission voltage information 18 as examples of data used for a program to be executed by the control unit 19. In addition to the above illustrated information, other electronic data, for example, record data of the amount of electric usage measured by a meter connected to a customer's load equipment, and electronic map data covering the whole or part of a control area controlled by the electric utility can also be stored together.

Here, the power distribution management apparatus 10 according to the embodiment manages the power distribution system by dividing the management into three position management to manage a position where equipment is installed, equipment management to manage each piece of equipment, electrical connection management to manage electrically interconnected pieces of equipment.

Of them, the position management uses, as entities, positions. "locations (location)" where predetermined pieces of equipment such as substations, power poles, and transformers, among equipment forming the power distribution system, are installed. Moreover, the equipment management uses, as entities, equipment "unit" tied to one position and equipment "span" tied to two positions among the equipment forming the power distribution system. Moreover, the electrical connection management uses, as entities, a connection point "node" electrically interconnecting pieces of equipment, and equipment "branch" defined by a plurality of connection points.

Figure 2:
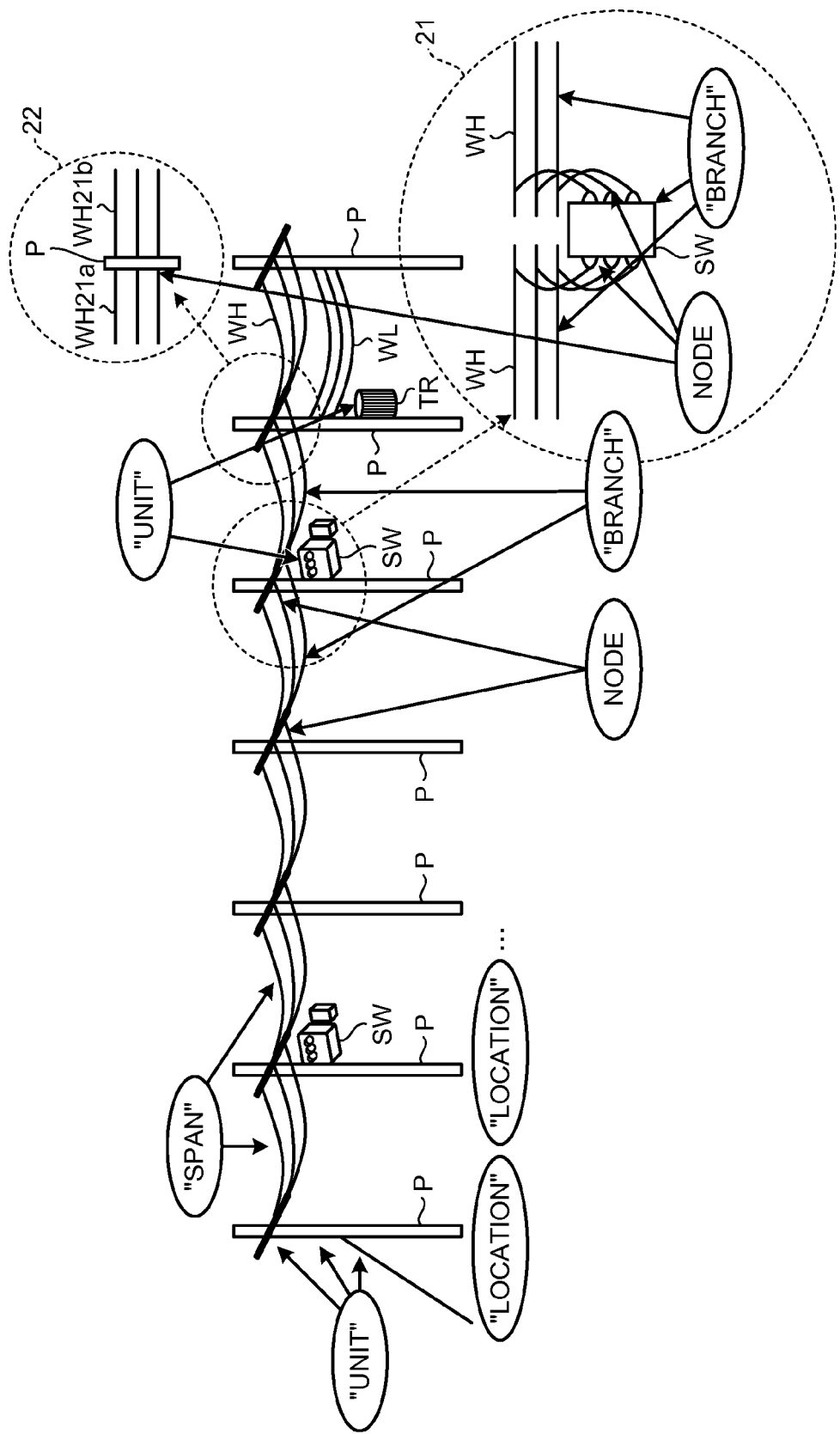
FIG. 2 is a diagram illustrating an aspect of entities.

FIG. 2 is a diagram illustrating an aspect of entities. As illustrated in FIG. 2, examples of the "location" include a position where non-overhead strung equipment in an installation form of not being strung overhead, such as a power pole P or a pole transformer TR, is installed. In addition, the category of "locations" also includes a position where an unillustrated distribution substation (SS: SubStation) is installed, and a position where a transformer is installed.

Examples of the "unit" include the power pole F, a switch SW, and the pole transformer TR. In addition, the category of "units" also includes the unillustrated distribution substation, a SVR (Step Voltage Regulator), and various meters, for example, a smart meter. Here, the equipment installed on the ground has been illustrated. However, the category of "units" also includes equipment installed underground, for example, a manhole and a hand hole.

An example of the "span" is a power line WE installed in the high voltage system that carries high voltage power between the distribution substation and the pole transformer TR, what is called a "high voltage line". Other examples of the "span" are a power line WL installed in a section between the pole transformer TR and a service drop of the low voltage system that carries low voltage power between the pole transformer TR and the customer's load equipment, what is called a "low voltage line," and also a power line installed in a section between the service drop and the load equipment, what is called a "service drop." Still another example of the "span" is a cable buried underground. In terms of a power line W such as the high voltage line WH or the low voltage line WL, wires in the unit of installation on the pole 5, the number of which is, for example, three or two, can be collectively treated as one "span".

Examples of the node include a connection point of the high voltage line WH and the switch SW illustrated in an enlarged view 21 in FIG. 2, and a connection point of the high voltage line WE and the pole transformer TR, and a connection point of the pole transformer TR and the low voltage line WL. In addition, the category of nodes also includes a point that connects a high voltage line WH21*a* and a high voltage line WH21*b* illustrated in an enlarged view 22 of FIG. 2. Specifically, also if the high voltage line WH21*a* and the high voltage line WH21*b* are installed on the pole P being a street assembled pole, the high voltage line WH21*a* and the high voltage line WH21*b* are assumed to be electrically connected. A point connecting the high voltage lines WE is treated as a virtual node.

Examples of the "branch" include various pieces of equipment such as the pole P, the high voltage line WH, the switch SW, the pole transformer TR, and the low voltage line WL, which are illustrated in FIG. 2. In addition, the category of "branches" also includes the unillustrated distribution substation, service drop, smart meter, and load equipment. Equipment located at an endpoint such as the distribution substation or load equipment may have only one node.

Figure 3:
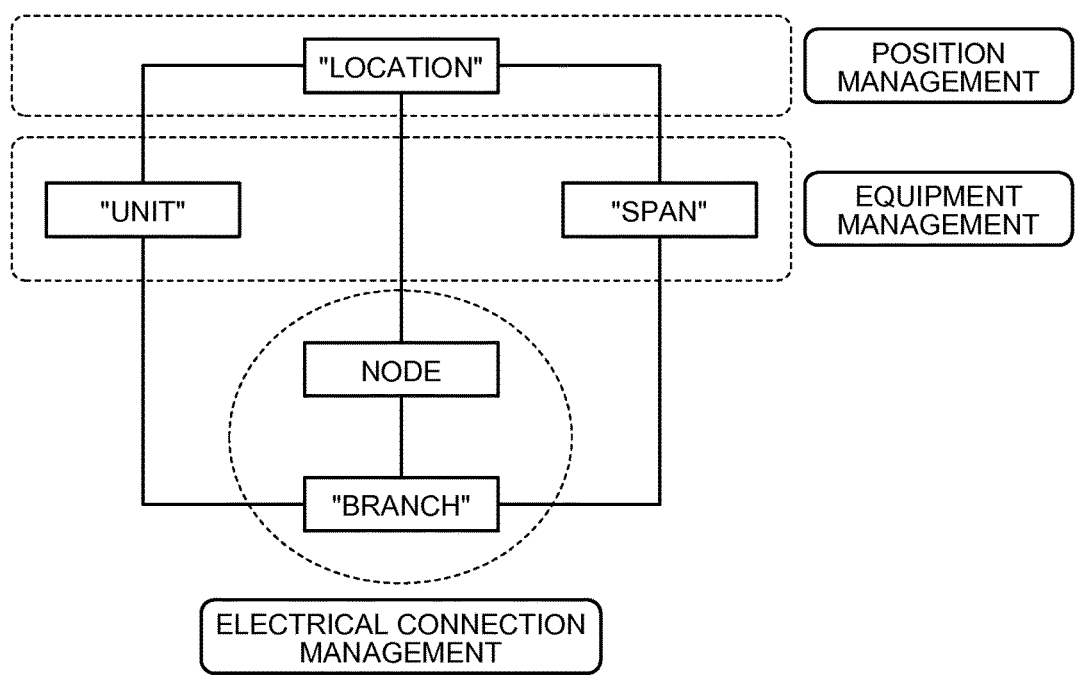
FIG. 3 is a diagram illustrating en example of an interrelation of the entities.

The entities of the "location", the "unit", the "span", the node, and the "branch" have relevance as illustrated in FIG. 3. FIG. 3 is a diagram illustrating an example of a mutual relation of the entities. As illustrated in FIG. 3, the "location" is used for managing position information of the "unit" and the "span". In addition, the "branch" is used for managing facility information of the "unit" and the "span". Furthermore, the "location" and the "branch" are related by the node.

Return to the description of FIG. 1. The position information 13 contains a "location" table 13*a* that manages the above "locations". Moreover, the equipment information 14 contains a "unit" table 14*a* that manages the above "units" and a "span" table 14*b* that manages the above "spans". Furthermore, the electrical connection information 15 contains a node table 15*a* that manages the above nodes, and a "branch" table 15*b* that manages the above "branches". Moreover, as described below, the power distribution system information 16 contains a current node table 16*a* and a current "branch" table 16*b*.

As an aspect of the "location" table 13*a* among the tables, a table where items such as a position ID (identifier), position type, longitude, and latitude are associated can be adopted. Such a "position ID" indicates identification information that identifies a position where equipment is installed. Moreover, the "position type" indicates the identification of the type of position, and includes, for example, types such as distribution substation (SS), pole (POLE), and load equipment (LOADL). In terms of information to be stored in the "location" table 13*a*, the position information of a specific piece of equipment such as a substation, pole, or transformer can be acquired from, for example, another existing system, for example, a power distribution management system that manages power distribution system equipment.

FIG. 4 is a diagram illustrating an example of the "location" table 13*a*. For example, a "location" with a position ID "SS0001" illustrated in FIG. 4 indicates that there is a distribution substation located at 50 degrees 27 minutes 23 seconds 016 north latitude and 128 degrees 08 minutes 48 seconds 66 east longitude. Moreover, various IDs illustrated in FIG. 4 and later are numbered by adding a character string that can identify the type of equipment such as "SS" representing a distribution substation, "PO" representing a pole, or load equipment "LL" to the start of a character string forming an ID. In terms of the various IDs, it is not limited to numbering by adding a character string that can identify the type of equipment to the start of a character string forming an ID, but a uniquely identifiable value may be added. Here, the case of using longitude and latitude as the items identifying the position of the equipment has been illustrated. However, other items such as a local coordinate value and address can also be used.

A table where items such as an equipment ID, a position ID, a type, and attribute information are associated can be adopted as an aspect of the "unit" table 14*a*. Such an "equipment. ID" indicates identification information that identifies equipment. Only the equipment ID of a "unit" is stored in the "unit" table 14*a*. Moreover, the "type" indicates the type of "unit". Examples of the type include such as pole (POLE), switch (SW), pole transformer (BANK), and load equipment (LOADL). Moreover, the "attribute information" indicates information on the attribute of a "unit". For example, the model number and performance of the "unit", and the capacity and voltage ratio of a transformer in a case, for example, where the "unit" is a transformer are registered. The capacity of such a transformer can be used for the calculation of voltage drop when electrical connection information of the current system equipment is extracted. For example, if the "unit" is a transformer, a resistance value, a reactance value, and a voltage ratio of the transformer are registered. Information to be stored in the "unit" table 14*a* is acquired from, for example, another existing system, for example, a power distribution equipment management system. The attribute information of equipment classified as the "unit" among the acquired attribute information of the equipment is registered.

FIG. 5 is a diagram illustrating an example of the "unit" table 14*a*. For example, a "unit" with an equipment ID "PO0001P1" illustrated. In FIG. 5 indicates a, pole located at a position corresponding to a position ID "PO0001", in other words, at 50 degrees 27 minutes 23 seconds 021 north latitude and 128 degrees 08 minutes 41 seconds 76 east longitude illustrated in FIG. 4. Moreover, a "unit" with an equipment ID "PO000101" illustrated in FIG. 5 indicates a switch located at a position corresponding to the position ID "PO0001", in other words, at 50 degrees 27 minutes 23 seconds 021 north latitude and 128 degrees 08 minutes 41 seconds 76 east longitude illustrated in FIG. 4. Moreover, a "unit" with an equipment ID "PO000701" illustrated in FIG. 5 indicates a pole transformer with a resistance value of "36800Ω", a reactance value of "31300Ω", and a voltage ratio of one, the pole transformer being located at a position corresponding to a position ID "PO0007", in other words, at 50 degrees 27 minutes 27 seconds 844 north latitude and 128 degrees 08 minutes 34 seconds 30 east longitude in the case of the example of FIG. 4.

A table where items such as an equipment ID, a position $ID_1$, a position $ID_2$, a type, and attribute information are associated can be adopted as an aspect of the "span" table 14b. The "position ID" referred to here also indicates the identification information that identifies equipment. However, only the equipment ID of the "span" is stored in the "span" table 14b. Moreover, the "position $ID_1$" indicates one of two position IDs tied to the "span". The "location $ID_2$" indicates the other position ID of the two position IDs tied to the "span". Moreover, the "type" indicates the type of "span". Examples of the type include a high voltage line, a low voltage line, and a service drop. Moreover, the "attribute information" indicates information on the attribute of the "span". For example, the model number, size, material, span, resistance value per unit (m), and reactance value per unit (m) of the "span" are registered. Such a span, resistance value per unit, and reactance value per unit can be used for the calculation of voltage drop when electrical connection information of the current system equipment is extracted. Information to be stored in the "span" table 14b is acquired from, for example, another existing system, for example, the power distribution equipment management system. The attribute information of equipment classified as the "span" among the acquired attribute information of the equipment is registered.

FIG. 6 is a diagram illustrating an example of the "span" table 14b. For example, a "span" with an equipment ID "SP0001" illustrated in FIG. 6 indicates a three-phase high voltage line installed in a section between a position corresponding to the position $ID_1$ "PO0001" and a position corresponding to the position $ID_2$ "PO0001". As described using FIG. 4, such a section corresponds to a section from 50 degrees 27 minutes 23 seconds 016 north latitude and 128 degrees 08 minutes 48 seconds 66 east longitude to 50 degrees 27 minutes 23 seconds 021 north latitude and 128 degrees 08 minutes 41 seconds 76 east longitude. Furthermore, the span, resistance, and reactance of the "span" with the equipment ID "SP0001" indicate "21 m," "220 Ω/m," "150 Ω/m," respectively. If the type illustrated in FIG. 6 is 3H, it indicates that the "span." is a single-phase three-wire high voltage line. If the type is 3L, it indicates the "span" is a single-phase three-wire, low voltage line. Moreover, if the type is blank, it indicates the "span" is a service drop.

A table where items such as a node ID and a position ID are associated can be adopted as an aspect of the node table 15a. Such a "node ID" indicates identification information that identifies a node. Information to be stored in the node table 15a is acquired from other existing systems, for example, the power distribution equipment, management system, and an automatic power distribution system that monitors the power distribution system and operates a switch remotely. For example, a node is extracted from information on lower voltage system equipment acquired from the power distribution equipment management system or information on high voltage system equipment acquired from the automatic power distribution system, then associated with the location of the node, and registered in the node table 15a.

FIG. 7 is a diagram illustrating an example of the node table 15a. For example, a connection point with a node ID "SS0001N01" illustrated in FIG. 7 indicates to be located at a position corresponding to the position ID "SS0001", in other words, at 50 degrees 27 minutes 23 seconds 016 north latitude and 128 degrees 08 minutes 48 seconds 66 east longitude illustrated in FIG. 4. Moreover, both of connection points with node IDs "PO0001N01" and "PO0001N02" illustrated in FIG. 7 indicate to be located at the same position corresponding to the position. ID "PO0001", in other words, at 50 degrees 27 minutes 23 seconds 021 north latitude and 128 degrees 08 minutes 41 seconds 76 east longitude illustrated in FIG. 4.

A table where items such as a branch ID, a node $ID_1$, a node $ID_2$, an equipment ID, and an open/closed division are associated can be adopted as an aspect of the "branch" table 15b. Such a "branch ID" indicates identification information that identifies a "branch". Moreover, the "node $ID_1$" indicates one node ID of two node IDs of a "branch". The "node $ID_2$" indicates the other node ID of the two node IDs of the "branch". However, a "branch" located at an endpoint such as the distribution substation or load equipment may have only one of the node $ID_1$ and the node $ID_2$. For example, a node ID of a connection point closer to the primary side than the node $ID_2$, in other words, closer to the substation, is registered in the node $ID_1$ out of the node $ID_1$ and the node $ID_2$. A node ID of a connection point closer to the secondary side than the node $ID_1$, in other words, closer to the load equipment, is registered in the node $ID_2$. Moreover, the "equipment ID" referred to here also indicates the identification information that identifies equipment. However, an equipment ID of either the "unit" or "span" is stored in the "branch" table 15b. Moreover, the "open/closed division" indicates the switch open/closed state of the switch. Either the "open state" or "closed state" is set in such an open/closed division if the "branch" is a switch, but is set to be "blank" if the "branch" is other than the switch.

Information to be stored in the "branch" table 15b is acquired from other existing systems, for example, the power distribution equipment management system and the automatic power distribution system. For example, a "branch" is extracted from information on low voltage system equipment acquired from the power distribution equipment management system, or information on high voltage system equipment acquired from the automatic power distribution system, then associated with a node(s) of the "branch", and registered in the "branch" table 15b.

FIG. 8 is a diagram illustrating an example of the "branch" table 15b. For example, a "branch" with a branch ID "BR0001" illustrated in FIG. 8 indicates a high voltage line with the equipment ID "SP0001" defined by the node $ID_1$ "SS0001N01" and the node $ID_2$ "PO0001N01". Moreover, a "branch" with a branch ID "BR0002" illustrated in FIG. 8 indicates a switch with the equipment ID "PO0001N01" defined by the node $ID_1$ "PO0001N01" and the node $ID_2$ "PO0001N02", and indicates that the switch is in the closed state since its open/closed division is "1". If the open/closed division illustrated in FIG. 8 is "0", it indicates that the switch is in the open state. Moreover, if the open/closed division is blank, it indicates that the equipment is not a switch. The closed state of the switch is a state of flowing electricity. The open state is a state of not flowing electricity.

Among the information to be stored in the storage unit 12, the power distribution system information 16, the forecast information 17, and the transmission voltage information 18, other than the above position information 13, equipment information 14, and electrical connection information 15, is described below in step with a description of functional units that generate, acquire, or use these pieces of information.

The control unit 19 includes an internal memory for storing a program stipulating various processing procedures, and control data, and executes various processes based on the program and control data. As illustrated in FIG. 1, the control unit. 19 includes a retrieval unit 19a, an association unit 19b, an acquisition unit 19c, a calculation unit 19d, and a determination unit 19e.

The retrieval unit 19a is a processing unit that refers to the electrical connection information 15, sets a predetermined node as a starting point, and retrieves a "branch" corresponding to a combination of nodes while searching for an unsearched node of nodes included in the combination of nodes.

As an aspect, the retrieval unit 19a starts a process if accepting a request to view the power distribution system information via the client terminal 30, or if a fixed period has passed since the previous execution of the process. Firstly, the retrieval unit 19a retrieves position IDs with a position type of the distribution substation "SS" among the position IDs stored in the "location" table 13a. The retrieval unit 19a then registers the position IDs of SS retrieved from the "location" table 13a in a search list stored in the unillustrated internal memory. In addition to the position. IDs of SS targeted for the search, unsearched nodes and "branches" found during the search are registered in such a search list at any time. Here, the case of retrieving the position. IDs of SS from the "location" table 13a was illustrated. However, it may be configured such that a node ID whose character string begins with "SS" among the node IDs stored in the node table 15a and the "branch" table 15b is retrieved.

Next, the retrieval unit 19a selects one position ID of SS registered in the search list. The retrieval unit 19a then retrieves a node corresponding to the position ID of SS for which the selection was made first among the nodes stored in the node table 15a. After that, the retrieval unit 19a registers a record of the node retrieved from the node table 15a in the current node table 16a stored as the power distribution system information 16 in the storage unit 12. Furthermore, the retrieval unit 19a registers the node retrieved from the node table 15a in the search list. If SS has a plurality of SS banks, records of a plurality of nodes are retrieved even if retrieval is performed using one position ID.

The retrieval unit 19a then selects one node registered in the search list. Next, the retrieval unit. 19a retrieves a record of a "branch" having a combination of node $ID_2$ including the node for which the selection was made first, in other words, a combination of the node $ID_1$ and the node $ID_2$ from among the "branches" stored in the "branch" table 15b. After that, the retrieval unit 19a registers the record of the "branch" retrieved from the "branch" table 15b in the current "branch" table 16b stored as the power distribution system information 16 in the storage unit 12. Furthermore, the retrieval unit 19a registers, in the search list, the "branch" retrieved from the "branch" table 15b. At this point in time, it is sufficient if one registered in the search list is information that can identify a "branch". For example, it is sufficient if at least either the branch ID or equipment ID is registered.

Next, the retrieval unit 19a selects one "branch" registered in the search list. The retrieval unit 19a then retrieves, from the "span" table 14b, attribute information corresponding to an equipment ID of the "branch" for which the selection was made first. At this point in time, if the "branch" is a "span", the attribute information can be retrieved from the "span" table 14b. However, if the "branch" is a "unit", the retrieval of the attribute information fails. Hence, the retrieval unit 19a retrieves, from the "unit" table 14a, the attribute information corresponding to the equipment ID of the "branch" for which the selection was made first, if the retrieval of the attribute information from the "span" table 14b failed.

If the other node paired with the node used for the search among the combination of nodes is not blank, then the retrieval unit 19a judges whether or not the "branch" is a switch. If the "branch" is a switch, then the retrieval unit 19a judges whether or not the switch is in the switch closed state, in other words, whether or not the open/closed division is "1". At this point in time, if the switch is in the switch closed state, the retrieval unit 19a retrieves a record of the other node from the node table 15a and then registers the record in the current node table 16a of the power distribution system information 16. Furthermore, the retrieval unit 19a adds the other node as an unsearched node to the search list.

The retrieval unit 19a then repeatedly executes the processing from the selection of an unsearched "branch" up to this point until searching for all the "branches" registered in the search list. If having searched for all the "branches" registered in the search list, then the retrieval unit 19a repeatedly executes the processing from the selection of an unsearched node up to this point until searching for all, the nodes registered in the search list. The retrieval unit 19a then repeatedly executes the processing from the selection of an unsearched position ID of SS up to this point, until searching for all the position IDs of SS registered in the search list.

The association unit 19b is a processing unit that associates equipment obtained as a result of a combination of connection points for which a search was made, and retrieval with attribute information corresponding to the equipment obtained as a result of the retrieval among pieces of attribution information included in the equipment information 14. As an aspect, the association unit 19b associates a record of a "branch" for which a search was made with attribute information of the "branch" retrieved from the "span" table 14b or the "unit" table 14a. For example, the association unit 19b associates attribute information of the "branch" used for the retrieval from the "span" table 14b or the "unit" table 14a with an equipment ID or branch ID of the "branch" among the records stored in the current "branch" table 15b and registers the attribute information of the "branch". At this point in time, the association unit 19b can also retrieve a position ID corresponding to the equipment ID of the "branch" from the "unit" table 14a or the "span" table 14b and further associate the position ID.

Here, the contents of processes by the retrieval unit 19a and the association unit 19b are specifically described using the tables of FIGS. 4 to 8. Firstly, among the position Its stored in the "location" table 13a illustrated in FIG. 4, the position ID "SS0001" whose position type is the distribution substation "SS" is retrieved. Then, the position ID "SS0001" of CS retrieved from the "location" table 13a is registered in the search list. In this case, only "SS0001" is registered as the position. ID of SS in the search list. Accordingly, the position ID "SS0001" is selected. In response to this, the node ID "SS0001N01" corresponding to the position ID "SS0001" of SS for which the selection was made first among the nodes stored in the node table 15a illustrated in FIG. 7 is retrieved. Next, a record of the node ID "SS0001N01" retrieved from the node table 15a is registered in the current node table 16a. Furthermore, the node ID "SS0001N01" retrieved from the node table 15a is registered also in the search list. In this case, only "SS0001N01" is registered as the node ID in the search list. Accordingly, the node ID "SS0001N01" is selected.

Then, the node $ID_1$ "SS0001N01" is retrieved among the "branches" stored in the "branch" table 15b illustrated in FIG. 8, and the "branch" of the equipment ID "SP0001" having the combination of the node $ID_1$ "SS0001N01" and the node $ID_2$ "PO0001N01" is found. After that, a record of the "branch" with the equipment ID "SP0001" retrieved from the "branch" table 15b is registered in the current "branch" table 16b. Furthermore, the equipment ID "SP0001" retrieved from the "branch" table 15b is registered in the search list. In this case, only "SP0001" is registered as the equipment ID. In the search list. Accordingly, the equipment ID "SP0001" is selected.

Attribute information "a span 21 m, resistance and reactance $X_{H1}$" of a "span" corresponding to the equipment ID "SP0001" for which the selection was made first is retrieved from the "span" table 14b illustrated in FIG. 6. Here, the case of retrieving the attribute information of the "span" was illustrated. However, in a case of an equipment ID beginning with a character string other than "SP", the attribute information is not retrieved from the "span" table 14b. Attribute information of a "unit" is retrieved from the "unit" table 14a illustrated in FIG. 5.

Based on the attribute information. "span 21 m, resistance 220 Ω/m, reactance 150 Ω/m" obtained in this manner, a resistance value of 4621 (220×21)Ω, and a reactance value of 3150 (150×21)Ω are associated with the record of the "branch" of the equipment ID "SP0001" used for the retrieval from the "span" table 14b, and registered in the current "branch" table 16b.

"PO0001N01" is subsequently set as a value in the other node ID paired with the node ID "SS0001N01" used for the search for the combination of the node $ID_1$ "SS0001N01" and the node $ID_2$ "PO0001N01". In this manner, the other node ID is not blank. Therefore, the "branch" with the equipment ID "SP0001" is judged whether or not to be a switch. The value of the open/closed division of the "branch" with the equipment ID "SP0001" is blank so that the "branch" is not a switch. Hence, the record of the other node ID "PO0001N01" is retrieved from the node table 15a. The record of the other node ID "PO0001N01" is then registered in the current node table 16a of the power distribution system information 16. Furthermore, the other node ID "PO0001N01" is added as the unsearched node to the search list.

In this manner, no node IDs except the node ID "PO0001N01" are registered at the time of registering the other node ID "PO0001N01" as the unsearched node in the search list. Hence, the node ID "PO0001N01" is selected, and then the search is continued.

Here, the case where the other node ID is not blank was illustrated. However, when the other node ID is blank, a search is made for an unsearched "branch" registered in the search list. Moreover, if there is no unsearched "branch", a search is made for an unsearched node. If there is no unsearched position ID of SS, the search is ended. Moreover, here, the case where, the "branch" is not a switch was illustrated. However, when the "branch" is a switch, a search for the other node ID, and further the addition of the other node to the search list are not executed unless the switch is in the switch closed state. This is because when a search for the other node ID and the addition of the other node to the search list are executed if the switch is in the switch open state, a different power distribution system that is not electrically connected is to be accidentally registered in the current node table 16a and the current "branch" table 16b.

The above search enables the creation of the current node table 16a that has retrieved, from among the "branches" registered in the node table 15a, nodes of the power distribution system where pieces of equipment are electrically interconnected at the point of making a search. Furthermore, the above search enables the creation of the current "branch" table 16b where "branches" of the power distribution system electrically interconnected at the point of making a search, and pieces of attribute information corresponding to the "branches" are associated after the retrieval of the "branches" and the pieces of attribute information from among the "branches" registered in the "branch" table 15b. In the following description, the power distribution system where pieces of equipment are electrically interconnected at the point of making a search may be described as the "current system."

The power distribution system information 16 containing the current node table 16a and the current "branch" table 16b, which have been created in this manner, is registered in the storage unit 12. FIG. 9 is a diagram illustrating an example of the current node table 16a FIG. 10 is a diagram illustrating an example of the current "branch" table 16b. These FIGS. 9 and 10 illustrate the current node table 16a and the current "branch" table 16b, which were created using the tables illustrated in FIGS. 4 to 8, where the node ID "SS0001N01" is set as the starting point.

As illustrated in FIG. 9, the amounts of power usage measured by meters such as smart meters are registered as examples of the attribute information in records of nodes "LL0001N01," "LL0002N01," "LL0003N01," "LL0004N01," "LL0005N01," LL0006N01, LL0007N01, and "LL0008N01" being connection points of pieces of load equipment of customers and pieces of equipment of the power distribution system among the records of the current node table 16a. Such amounts of power usage include "active power" that is consumed by the load equipment, and "reactive power" that is not consumed by the load equipment. Of them, the reactive power is also called lagging reactive power. The amount of power usage (active) and the amount of power usage (reactive) are referred to in a case of calculating a voltage at each node.

As illustrated in FIG. 10, the value of the open/closed division registered. In the "branch." table 15b is registered in records that the equipment of a "branch" is a switch among the records of the current "branch" table 16b. For example, "1" is registered in the open/closed division for all switches with branch IDs "BR0002," "BR0006," and "BR0019". Accordingly, it indicates that the switches are in the switch closed state and in the conductive state. FIG. 10 illustrates the switches whose open/closed division "1". However, if the open/closed division of the switch is "0", it indicates that the switch is in the switch open states and is not in the conductive state. Moreover, a reactance value X and a resistance value R are registered as examples of the attribute information in each record of the current "branch" table 16b. The reactance value X and the resistance value R, which are registered in the "unit" table 14a, are registered as the distribution information as they are for equipment of a "branch" that is a "unit", for example, a switch or transformer among the records of the current "branch" table 16b. On the other hand, a value obtained by multiplying a reactance value per unit registered in the "span" table 14b by the value of a span is registered as the reactance value X, and a value obtained by multiplying resistance value per unit by the value of a span as the resistance value R, for equipment of a "branch" that is a "span". The reactance values X and the resistance values R of the "unit" and "span" are referred to in the case of calculating a voltage, at each node.

Here, the amount of power usage (active), the amount of power usage (reactive), the resistance value, and the reactance value were illustrated as parameters used for the calculation of a voltage. However, a voltage, can be calculated more accurately by adding an item of a connection phase to which a transformer is connected to either the current node table 16a or the current "branch" table 16b. For example, if the power line is a single-phase three-wire, it is possible to set a first transformer connected to the power line on a pole as a "connection phase 1," a second transformer as a "connection phase 2," and a third transformer as a "connection phase 3," and register a value "A" in a case where the transformer is connected to the first and second wires of the three-wire power line, a value "B" in a case where a transformer is connected to the second and third wires, and a value "C" in a case where a transformer is connected to the first and third wires.

Figure 11:
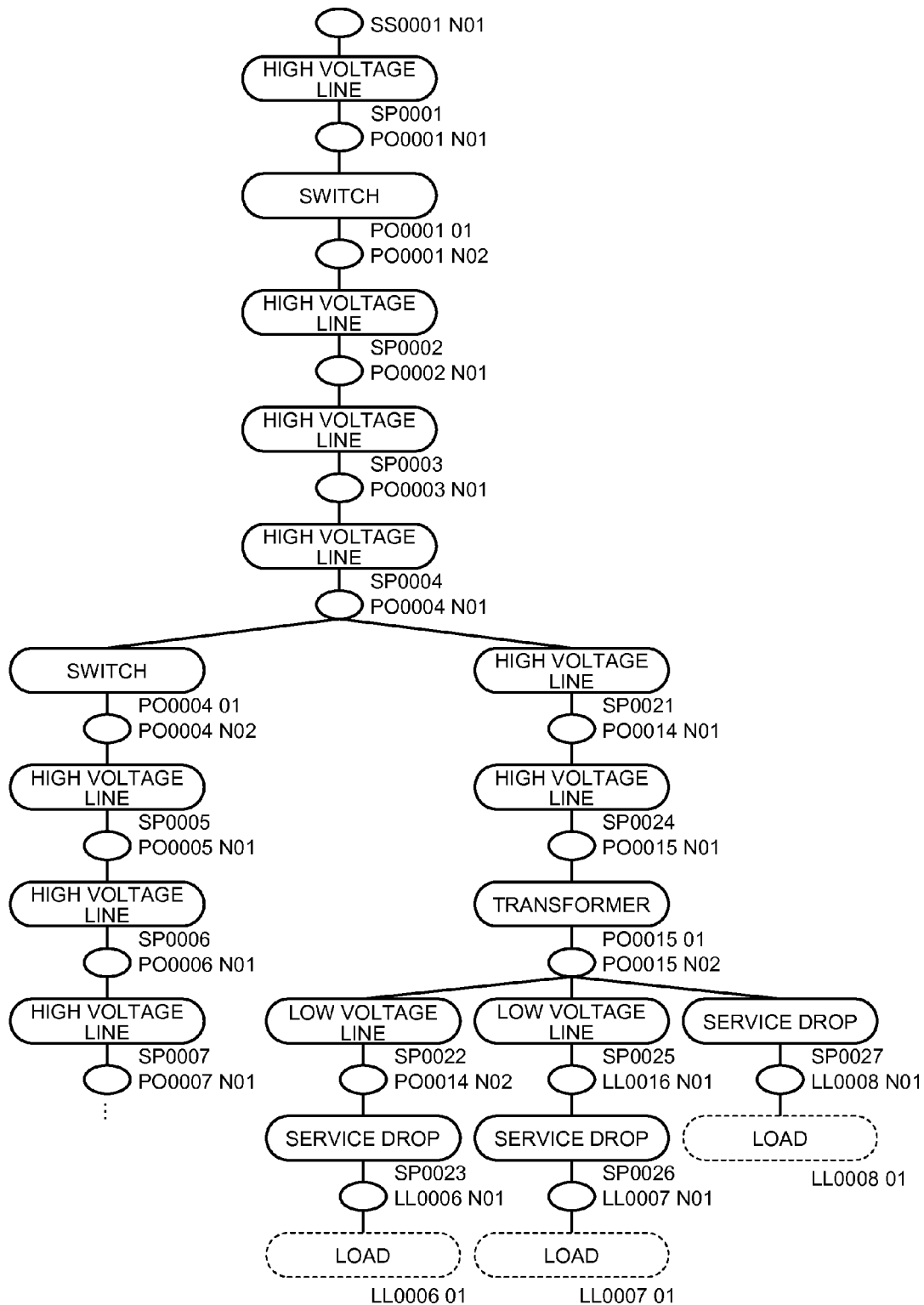
FIG. 11 is a diagram (1) illustrating an example of data for display.
Figure 12:
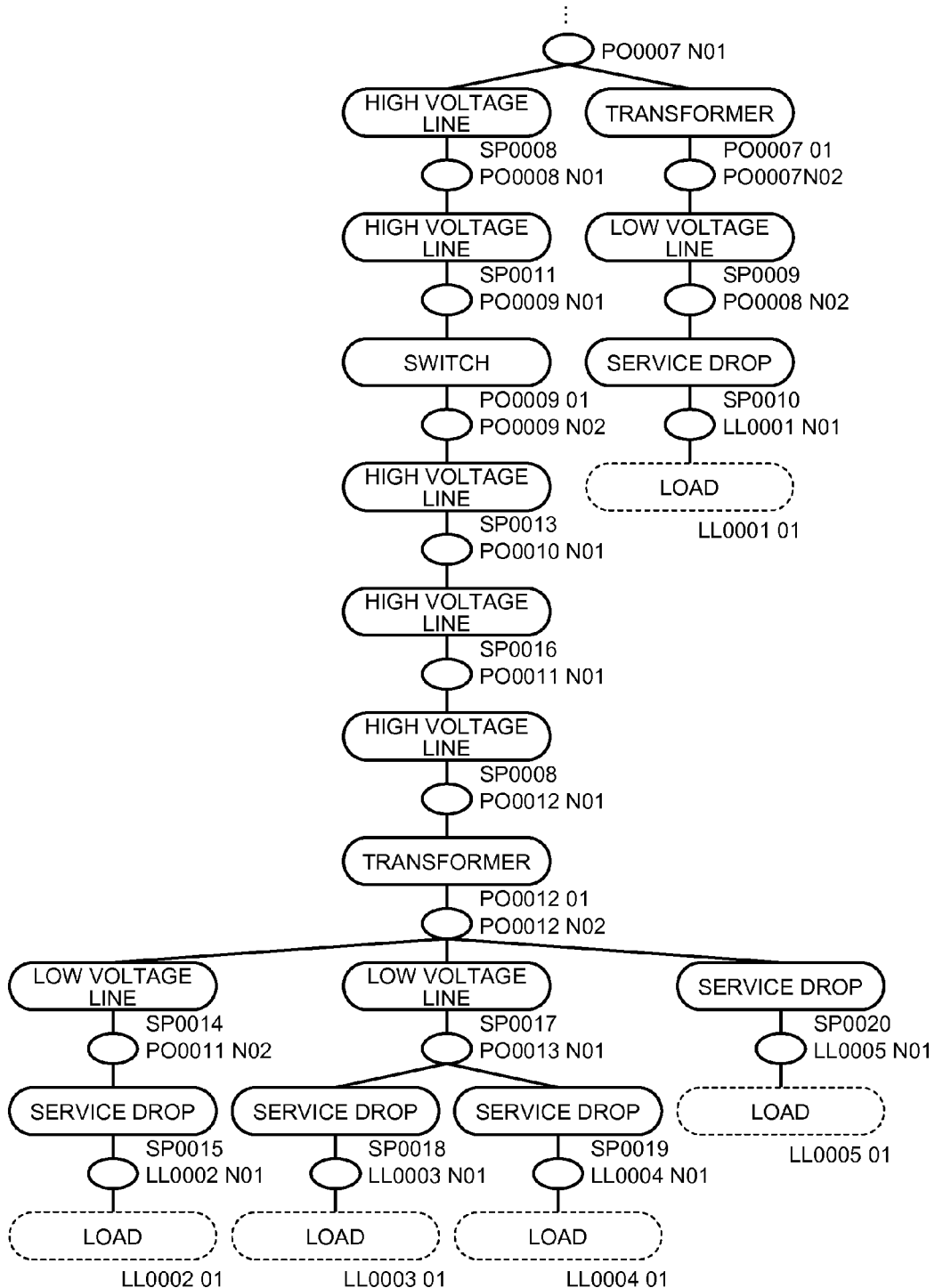
FIG. 12 is a diagram (2) illustrating an example of the data for display.

In this manner, the power distribution system information 16 created from the current node table 16a illustrated in FIG. 9, and the current "branch" table 16b illustrated in FIG. 10 represents a graph structure of the power distribution system illustrated in FIGS. 11 and 12.

FIGS. 11 and 12 are diagrams illustrating an example of the graph structure of the current system. The current system illustrated in FIGS. 11 and 12 has a node with the node ID "SS0001N01" being the connection point of the SS bank and the high voltage line of the equipment ID "SP0001", at a root (first layer) of as hierarchical structure. Furthermore, the current system has paths from the root toward eight pieces of load equipment with equipment IDs "LL000101," "LL000201," "LL000301," "LL000401," "LL000501," "LL000601," "LL000701," and "LL000801" being endpoints. It can be seen that of them, a hierarchy from the SS bank to the load equipment with the equipment ID "LL000801" is the shallowest, 10 layers, and hierarchies from the SS bank to the pieces of the load equipment with the equipment IDs "LL000201," "LL000301," and "LL000401" are the deepest, 19 layers. In this manner, the above power distribution system information 16 is generated. Accordingly, it is possible to grasp electrical links of the current system by the segmentation into not such rough units as the high voltage system and the low voltage system, but units of the equipment, and further units of the connection point of pieces of equipment.

Here, the forecast information 17 stored in the storage unit 14 is described. Such forecast information 17 contains a demand forecast table related to the amount of demand where the amount of power to be used at the load equipment of a customer is forecast, and a power generation forecast table related to the amount of power generation where the amount of power generated by power generation equipment of the customer is forecast.

As an aspect of the demand forecast table of them, data where an equipment ID of the load equipment of the customer, the date and time when a forecast was made, and the forecast amount of power usage, are associated can be adopted. In the following description, the date she time when a forecast was made and the forecast amount of power usage may be described as the "forecast date," "forecast time," and "forecast demand amount." In terms of such a "forecast demand amount," as an example, a forecast is made based on a season corresponding to the forecast date, and a temperature estimated from a time slot corresponding to the forecast time, and the amount of power used in the past by the load equipment of the customer.

Moreover, as an aspect of the power generation forecast table, data where the equipment ID of the load equipment of the customer, the date and time when a forecast was made, the forecast amount of power generation are associated can be adopted. In the following description, the date and time when a forecast was made and the forecast amount of power generation may be described as the "forecast date," "forecast time," and "forecast power generation amount." In terms of such a "forecast power generation amount," as an example, a forecast is made based on a season corresponding to the forecast date, the amount of solar radiation estimated from a time slot corresponding to the forecast time, and the amount of power generated in the past by the power generation equipment of the customer.

The acquisition unit 19c is a processing unit that acquires the forecast demand amount and forecast power generation amount of each customer according to the time slot. As an aspect, the acquisition unit 19c acquires the forecast information 17 stored in the storage unit 12. For example, the acquisition unit 19c acquires, from the demand forecast table, a forecast demand amount corresponding to an equipment. It of load equipment of a customer among current "branches" and to the forecast time corresponding to a date and time slot targeted for acquisition. Furthermore, the acquisition unit 19c acquires, from the power generation forecast table, a forecast power generation amount corresponding to the equipment ID of the load equipment of the customer among the current "branches" and to the forecast time corresponding to the date and time slot targeted for acquisition. As another aspect, the acquisition unit 19c, can also acquire the forecast demand amount and the forecast power generation amount from an external forecast apparatus that forecasts the amount of demand and the amount of power generation, by referring to weather information of a time slot on a time slot basis. As still another aspect, the acquisition unit 19c may accept the inputs of the forecast demand amount and forecast power generation amount of each customer on a time slot basis from the client terminal 30.

Be calculation unit 19d is a processing unit that sets a plurality of voltage values as a plurality of candidates for the transmission voltage from the substation of the power distribution system, and calculates a voltage at a connection point of load equipment of a customer and equipment of the power distribution system at each of the candidates for the transmission voltage by utilizing a difference between the forecast demand amount and the forecast power generation amount of the customer. In the embodiment, a case is assumed in which five, voltages "6900 V", "6750 V", "6600 V", "6450 V", and "6300 V" that the substation of the power distribution system can transmit are set as the plurality of candidates.

As an aspect, the calculation unit 19d calculates a difference between the forecast demand amount and the forecast power generation amount of each customer on a time slot basis if the acquisition unit 19c acquires the forecast demand amount and forecast power generation amount of each customer on a time slot basis. At this point in time, if the difference between them takes a negative value, it can be predicted that a reverse flow occurs in which, the power generated by the power generation equipment of the customer flows in a direction from the load equipment toward the power distribution system. In this case, the selling of power is performed in which the customer sells power to the electric utility. Next, the calculation unit 19d selects one of the time slots within one day.

After that, the calculation unit 19d uses the difference between the forecast demand amount and the forecast power generation amount of each, customer in the time slot for which the selection was made, first to calculate a voltage at a current node of load equipment of each customer at each of the candidates for the transmission voltage. For example, the calculation unit 19d reads information used for the calculation of a voltage from the current "branch" table 16b. As an example, the calculation unit 19d acquire, the voltage ratio of the transformer, and further the resistance, reactance, and the like of the power line. The calculation unit 19d then assumes that the candidate for the transmission voltage is a transmission voltage from the substation, and calculates a voltage at each current node using parameters such as the voltage ratio of the transformer, and the resistance, reactance, and the like of the power line, including the difference between the forecast demand amount and the forecast power generation amount of each customer.

Existing algorithms from BFS (Backward-Forward Sweep) to the Newton-Raphson method can be adaptively adopted as examples of such a method for calculating a voltage. For example, if BFS is adopted, the characteristic that the power distribution system is radial is made use of to alternately execute a sequential computation from the load equipment and make a modification from the substation. Accordingly, a voltage at each current node is calculated.

In this manner, the voltages of end-current nodes of the load equipment of the customers are calculated at each of the candidates for the transmission voltage. After a voltage at the current node of the load equipment of each customer and the equipment of the power distribution system is calculated, a similar calculation process is repeatedly performed on all the time slots.

The determination unit 19e is a processing unit that determines a transmission voltage of the substation from among the plurality of candidates for the transmission voltage based on the calculation results of the voltages at the current nodes. As an aspect, the determination unit 19e counts deviation spots where the voltage at a current node of load equipment of a customer deviates from the tolerance range, for example, 101 V±6 V, of a predetermined standard voltage if each candidate is set as the transmission voltage at each of the candidates for the transmission voltage, in units of a switch section sectioned by the customer, transformer, and switch. For example, when the deviation spots are counted in units of the transformer, even if the same transformer has deviations from the tolerance range at the current "branches" of a plurality of customers, the count of the deviation spots is one. This is also applied to a case where the deviation spots are counted in units of the switch section.

The determination unit 19e then judges whether or not there is a plurality of candidates for the transmission voltage that have the same minimum value of the number of deviation spots counted in units of the transformer, in other words, whether or not there is a plurality of candidates for the transmission voltage that have the same minimum value of the number of transformers including a customer at which the voltage deviates from the tolerance range. At this point in time, if there is only one candidate for the transmission voltage that has the same minimum value of the number of deviation spots counted in units of the transformer, the determination unit 19e determines the candidate for the transmission voltage as a transmission voltage of a substation bank in the time slot for which the selection was made first. In this manner, the reason for adopting a candidate, for the transmission voltage that has a minimum number of deviation spots counted in units of the transformer is to minimize the man hours to carry out construction work for the adjustment of a tap of the transformer.

Moreover, if there is a plurality of candidates for the transmission voltage that have the same minimum value of the number of deviation spots counted in units of the transformer, the determination unit 19e further makes the following judgment among the plurality of candidates for the transmission voltage that have the same minimum value. In other words, the determination unit 19e further judges whether or not there is a plurality of candidates for the transmission, voltage that have the same minimum value of the number of deviation spots counted in units of the customer, in other words, whether or not there is a plurality of candidates for the transmission voltage that have the same minimum value of the number of customers at which the voltage deviates from the tolerance range. At this point in time, if there, is only one candidate for the transmission voltage, that has the same minimum value of the number of deviation spots counted in units of the customer, the determination unit 19e determines the candidate for the transmission voltage as the transmission voltage of the substation bank in the time slot for which the selection was made first. In this manner, the reason for adopting a candidate for the transmission voltage that has a minimum number of deviation spots counted in units of the customer is to minimize the number of customers who become unable to sell power due, to the deviation of the voltage from the tolerance range.

Furthermore, if there is a plurality of candidates for the transmission voltage that have the same minimum value of the number of deviation spots counted in unite of the customer, the determination unit 19e further executes the following process among the plurality of candidates for the transmission voltage that have the same minimum value. In other words, the determination unit 19e determines a candidate for the transmission voltage that has the same minimum value of the number of deviation spots counted in units of the switch section, in other words, a candidate for the transmission voltage that has a minimum number of switch sections including a customer at which the voltage deviates from the tolerance range, as the transmission voltage of the substation bank in the time slot for which the selection was made first. In this manner, the reason for adopting a candidate for the transmission voltage that has a minimum number of deviation spots counted in units of the switch section is to minimize construction work across the switch sections if the scope of the construction work such as the adjustment of a tap of the transformer is impossible to be narrowed down to the units of the transformer.

Moreover, if the number of candidates for the transmission voltage was impossible to be cut to one in any judgment in units of the transformer, in units of the customer, and in units of the switch section, the determination unit 19e determines the transmission voltage of the substation bank as follows: for example, the determination unit 19e determines a candidate closest to a median value of all the candidates among the plurality of candidates for the transmission voltage as the transmission voltage of the substation bank if there are three, or more candidates for the transmission voltage narrowed down by determinations in units of the transformer, in units of the customer, and in units of the switch section. Moreover, if the number of candidates for the transmission voltage narrowed down is two, a candidate having a minimum average value of deviations of a case where a voltage at a current node of load equipment of each customer deviates from the tolerance range is determined as the transmission voltage of the substation bank.

The determination unit 19e then repeatedly executes the process of determining the transmission voltage of the substation bank on a time slot basis until the transmission voltage of the substation bank is determined for all the time slots. If the transmission voltage of the substation bank is determined for all the time slots, then the determination unit 19e creates a transmission voltage schedule table where each time slot is associated with a transmission voltage of the substation bank. The transmission voltage schedule table created in this manner is registered as the transmission voltage information 18 in the storage unit 12. Such a schedule table is transmitted to an apparatus that sets the transmission voltage of the substation. Accordingly, the control of the transmission voltage as scheduled becomes possible.

FIG. 13 is a diagram illustrating an example of the schedule table. The example of FIG. 13 indicates a schedule where the transmission voltage is set to 6900 V from 9 o'clock to 10 o'clock, 6750 V from 10 o'clock to 11 o'clock, and 6750 V from 11 o'clock to 12 o'clock. Also in the subsequent time slots, the transmission voltage is set to 6450 V, 6450 V, 6450 V, 6600 V, 6600 V and 6750 V sequentially. In the embodiment, the case of setting a daily transmission voltage schedule is illustrated. However, not a daily but a weekly or monthly schedule may be determined, and any period of time can be used also for the length of a time slot.

Various integrated circuits and electronic circuits can be adopted for the control unit 19. Moreover, a part of the functional units of the control unit 19 can also be designed to be another integrated circuit or electronic circuit. Examples of the integrated circuit include an ASIC (Application Specific Integrated Circuit). Moreover, examples of the electronic circuit include a CPU (Central Processing Unit) and an MPU (Micro Processing Unit).

[Flows of Processes]

Next, the flows of processes of the power distribution management apparatus 10 according to the embodiment are described. Here, a description is given as follows: (1) a power distribution management process, and then (2) the voltage determination process, which are executed by the power distribution management apparatus 10.

(1) Power Distribution Management Process

Figure 14:
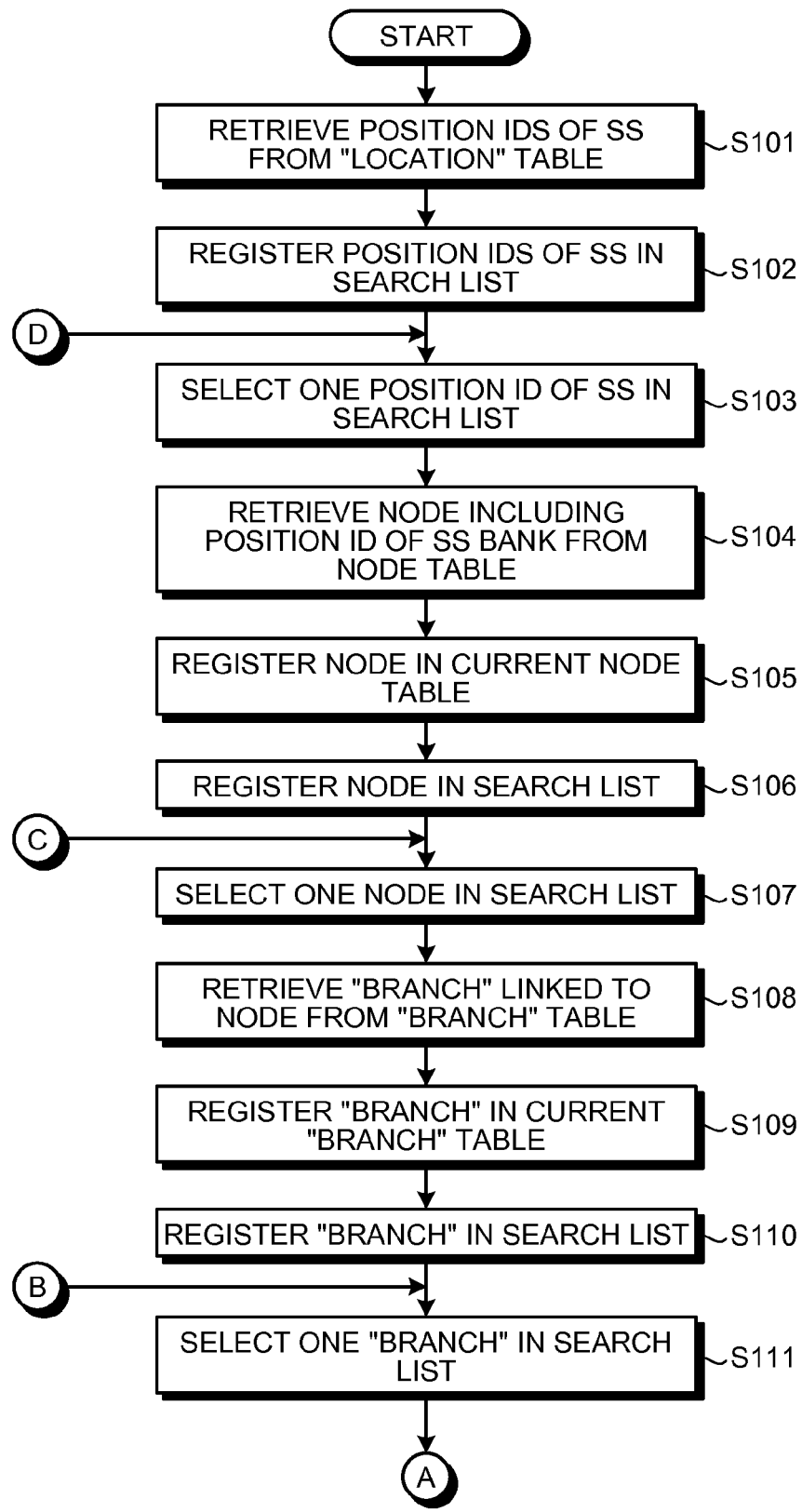
FIG. 14 is a flowchart (1) illustrating the procedure of a power distribution management process according to a first embodiment.
Figure 15:
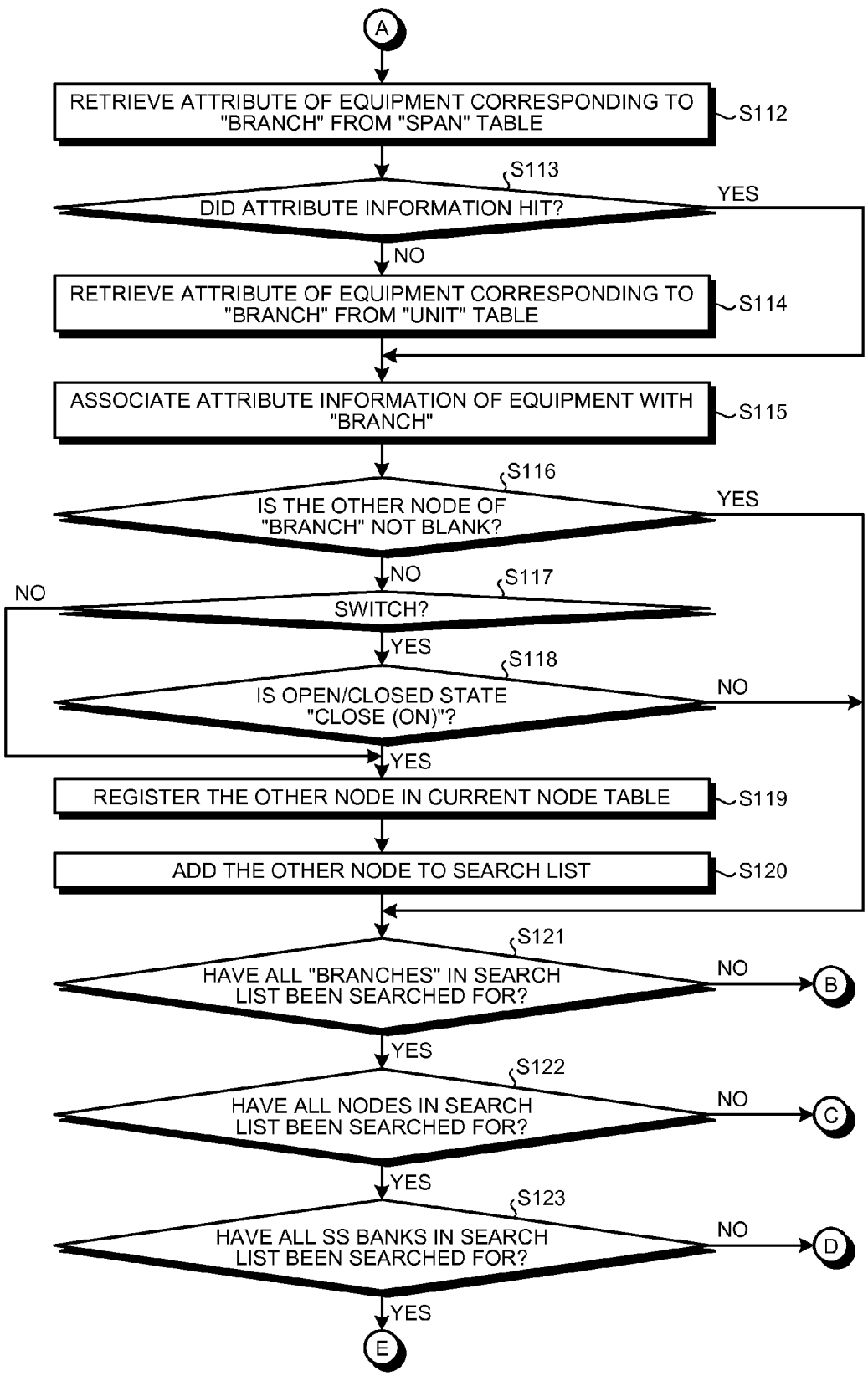
FIG. 15 is a flowchart (2) illustrating the procedure of the power distribution management process according to the first embodiment.
Figure 16:
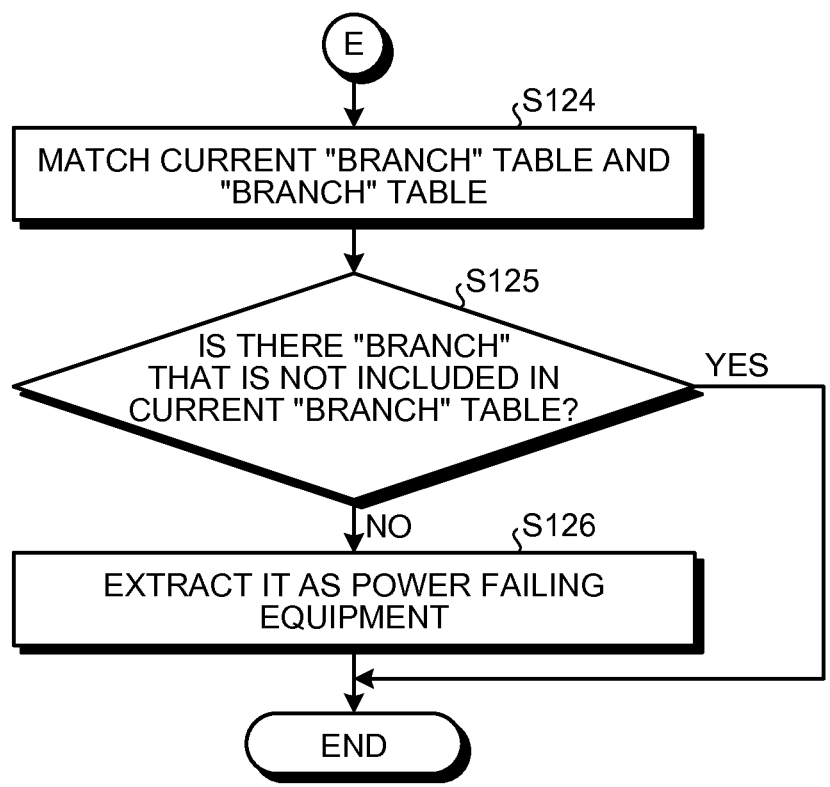
FIG. 16 is a flowchart (3) illustrating the procedure of the power distribution management process according to the first embodiment.

FIGS. 14 to 16 are flowcharts illustrating the procedure of the power distribution management process according to the first embodiment. The power distribution management process is started if a request to view a power distribution system screen has been accepted via the client terminal 30, or if a fixed period has passed since the previous execution of the process.

As illustrated in FIG. 14, the retrieval unit 19*a* retrieves position IDs whose position type is the distribution substation "SS" among the position IDs stored in the "location" table 13*a* (Step S101). The retrieval unit 19*a* then registers the position IDs of SS retrieved from the "location" table 13*a* in the search list (Step S102).

Next, the retrieval unit 19*a* selects one position ID of SS registered in the search list (Step S103). The retrieval unit 19*a* then retrieves a node corresponding to the position ID of SS for which the selection was made first among the nodes stored in the node table 15*a* (Step S104).

After that, the retrieval unit 19*a* registers a record of the node retrieved from the node table 15*a* in the current node table 16*a* stored as the power distribution system information 16 in the storage unit 12 (Step S105). Furthermore, the retrieval unit 19*a* registers, in the search list, the node retrieved from the node table 15*a* (Step S106).

The retrieval unit 19*e* then selects one node registered in the search list (Step S107). Next, the retrieval unit 19*a* retrieves a record of a "branch" having a combination of node IDs including the node selected in Step S107, in other words, a combination of the node ID$_1$ and the node ID$_2$, among the "branches" stored in the "branch" table. 15*b* (Step S108).

After that, the retrieval unit 19*a* registers, in the current "branch" table 16*b*, the record of the "branch" retrieved in Step S108 (Step S109). Furthermore, the retrieval unit 18*a* registers, in the search list, the "branch" retrieved in Step S108 (Step S110). Next, the retrieval unit 19*a* selects one "branch" registered in the search list (step S111).

As illustrated in FIG. 15, the retrieval unit 19*a* then retrieves attribute information corresponding to an equipment ID of the "branch" selected in Step S111 from the "span" table 14*b* (Step S112). At this point in time, if the retrieval of the attribute information from the "span" table. 14*b* failed, in other words, if the attribute information did not hit (No in Step S113), the retrieval unit 19*a* executes the following processing.

In other words, the retrieval unit 19*a* retrieves the attribute information corresponding to the equipment ID of the "branch" selected in Step S111 from the "unit" table 14*a* (Step S114). If the retrieval of the attribute information from the "span" table 14*b* was successful (Yes in Step S113), the processing of Step S114 is skipped to shift to the processing of Step S115.

The association unit 19*b* then associates the attribute information of the "branch" with the record of the "branch" used for the retrieval from the "span" table 14*b* or the "unit" table 14*a* among the records stored in the current "branch" table 16*b*, and registers the attribute information of the "branch" (Step S115).

The retrieval unit 19*a* subsequently judges whether or not the other node is blank which is paired with the node used for the search in Step S108 among the combination of the nodes of the "branch" retrieved in Step S108 (Step S116).

At this point in time, if the other node is not blank (No in Step S116), the retrieval unit 19*a* further judges whether or not the "branch" is a switch (Step S117). If the "branch" is a switch (Yes in Step S117), then the retrieval unit 19*a* further judges whether or not the switch is in the switch closed state, in other words, whether or not the switch is in the ON state (Step S118).

Here, if the switch is in the ON state (Yes in Step S118), the retrieval unit 19*a* retrieves a record of the other node from the node table 15*a* and then registers the record in the current node table 16*a* of the power distribution system information 16 (Step S119). Furthermore, the retrieval unit 19*a* adds the other node as the unsearched node to the search list (Step S120).

Moreover, also if the "branch" is not a switch (No in Step S117), the retrieval unit 19*a* retrieves the record of the other node from the node table 15*a* and then registers the record in the current node table 16*a* of the power distribution system information 16 (Step S119). Furthermore, the retrieval unit 19*a* adds the other node as the unsearched node to the search list (Step S120).

On the other hand, if the other node is blank, or if the switch is in the OFF state (Yes in Step S116 or No in Step S118), execution shifts to the processing of Step S121.

The retrieval unit 19*a* subsequently judges whether or not to have searched for all the "branches" registered in the search list (Step S121). At this point in time, if not all the "branches" registered in the search list have been searched for (No in Step S121), an unsearched "branch" is selected (Step S111), and then the processing from Step S112 to Step S121 is repeatedly executed.

If all the "branches" registered in the search list have subsequently been searched for (Yes in Step S121), the retrieval unit 19*a* judges whether or not all the nodes registered in the search list have been searched for (Step S122). At this point in time, if not all the nodes registered in the search list have been searched for (No in Step S122), an unsearched node is selected (Step S107), and then the processing form Steps S108 to Step S121 is repeatedly executed.

If all the nodes registered in the search list have been searched for (Yes in Step S122), the retrieval unit 195 judges whether or not all the position IDs of SS registered in the search list have been searched for (Step S123). At this point in time, if not all the position IDs of SS registered in the search list have been searched for (No in Step S123), an unsearched position ID of SS is selected (Step S103), and then the processing form Steps S104 to Step S122 is repeatedly executed.

If all the position IDs of SS registered in the search list, have been searched for (Yes in Step 123), then the retrieval unit 19a matches the records of the "branches" stored in the "branch" table 15b and the records of the "branches" stored in the current "branch" table 15b as illustrated in FIG. 16 (Step S124).

Here, if the "branch" table 15b contains a record of a "branch" that does not match with the current "branch" table 16b (No in Step S125), the retrieval unit 19a detects equipment with an equipment ID included in the record of the "branch" as a power failure spot (Step S126), and ends the process. On the other hand, if the "branch." table 15b contains no record of a "branch" that does not match with the current "branch" table 16b (Yes in Step S125), the process is ended without any further processing.

(2) Voltage Determination Process

Figure 17:
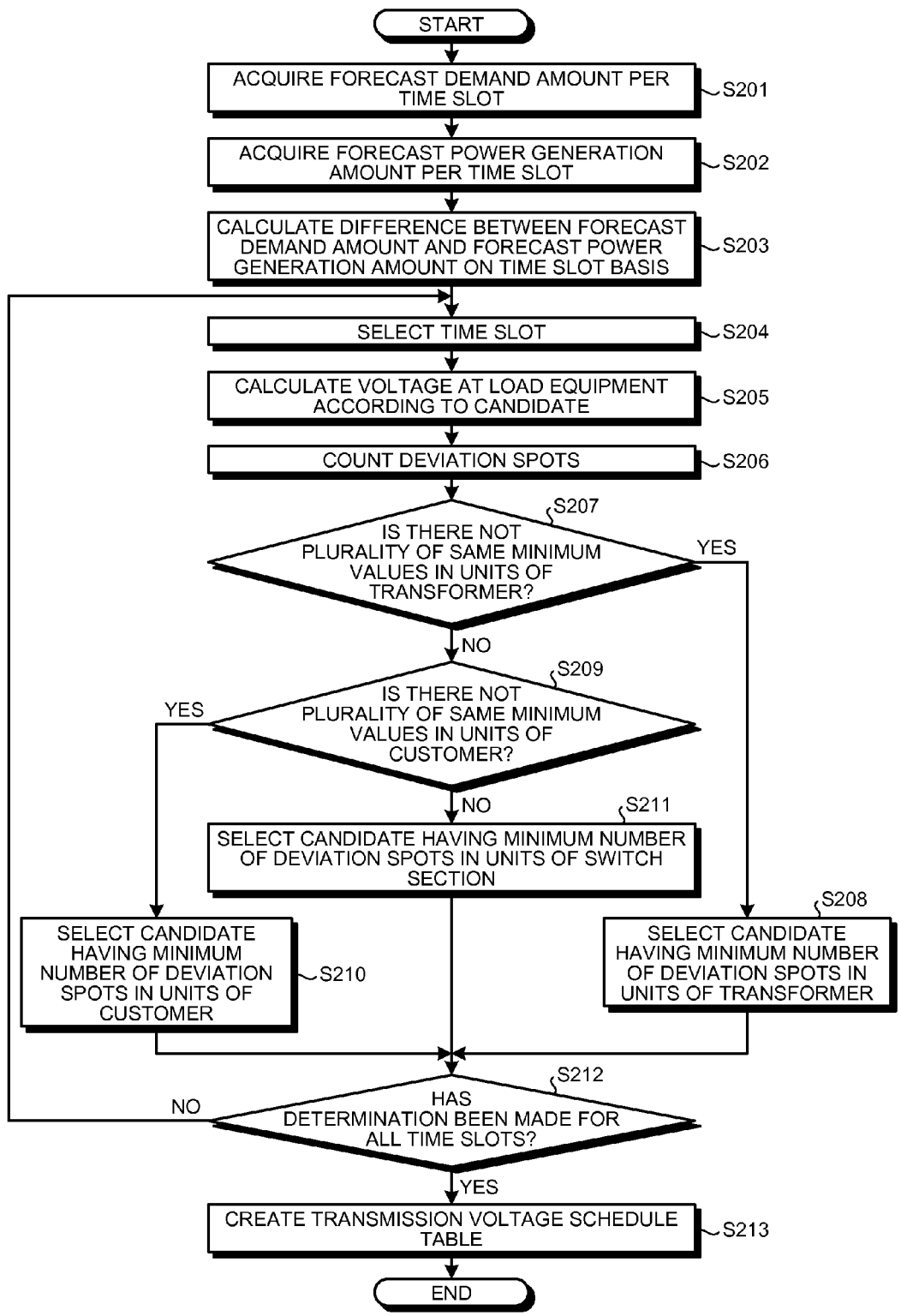
FIG. 17 is a flowchart illustrating the procedure of a voltage determination process according to the first embodiment.

FIG. 17 is a flowchart illustrating the procedure of the voltage determination process according to the first embodiment. The display control process is executed at times, such as when a predetermined period of time, for example, one day or three hours, has passed since the previous execution of the process of determining the transmission voltage, or when a request to determine the transmission voltage has been accepted from the client terminal 30.

As illustrated in FIG. 17, the acquisition unit 19c acquires the forecast demand amount of each customer per time slot from the demand forecast table stored in the storage unit 12 and also acquires the forecast power generation amount of each customer per time slot from the power generation forecast table (Steps S201 and S202).

The calculation unit 19d subsequently calculates a difference between the forecast demand amount of each customer acquired in Step S201 and the forecast power generation amount of each customer acquired in Step S202, on a time slot basis (Step S203).

Next, the calculation unit 19d selects one of the time slots within one day (Step S204). After that, the calculation unit 19d uses the difference between the forecast demand amount and the forecast power generation amount of each customer calculated in Step S203, targeting the time slot for which the selection was made in Step S204, and calculates a voltage at a current node of load equipment of each customer at each of the candidates for the transmission voltage (Step S205).

The determination unit 19e then counts deviation spots where the voltage at the current node of the load equipment of each customer deviates from the tolerance range of the predetermined standard voltage when each candidate for the transmission voltage is set as the transmission voltage, in units of the customer, transforms and switch section (Step S206).

If there is only one candidate for the transmission voltage that has the same minimum value of the number of deviation spots counted in units of the transformer (Yes in Step S207), the determination unit 19e determines the candidate for the transmission voltage as the transmission voltage of the substation bank in the time slot for which the selection was made first (Step S208).

Moreover, if there is a plurality of candidates for the transmission voltage that have the same minimum value of the number of deviation spots counted in units of the transformer (No in Step S207), the determination unit 19e further makes the following judgment among the plurality of candidates for the transmission voltage that have the same minimum value. In other words, the determination unit 19e further judges whether or not there is a plurality of candidates for the transmission voltage, that have the same minimum value of the number of deviation spots counted in units of the customer (Step S209).

At this point in time, if there is only one candidate for the transmission voltage that has the same minimum value of the number of deviation spots counted in units of the customer (Yes in Step S209), the determination unit 19e determines the candidate for the transmission voltage as the transmission voltage of the substation bank in the time slot for which the selection was made first (Step S210).

On the other hand, if there is a plurality of candidates for the transmission voltage that have the same minimum value of the number of deviation spots counted in units of the customer (No in Step S209), the determination unit 19e determines the candidate for the transmission voltage that has the same minimum value of the number of deviation spots counted in units of the switch section, as the transmission voltage of the substation bank in the time slot for which the selection was made first (Step S211).

Afterward, the processing of the above Steps S204 to S211 is repeatedly executed until the transmission voltage of the substation bank is determined for all the time slots (No in Step S212). When the transmission voltage of the substation bank is determined for all the time slots (Yes in Step S212), the determination unit 19e creates a transmission voltage schedule table where each time slot is associated with a transmission voltage of the substation bank (Step S213), and ends the process.

Effects of First Embodiment

As described above, if determining the transmission voltage of the substation, the power distribution management apparatus 10 according to the embodiment uses a difference between the forecast demand amount and the forecast power generation amount of each customer to determine an optimum candidate as the transmission voltage from a plurality of candidates. Hence, the power distribution management apparatus 10 according to the embodiment can set, for the substation, the transmission voltage to which a reverse flow has been added. Therefore, the power distribution management apparatus 10 according to the embodiment can suppress the power beyond the tolerance range of voltage from flowing in the power distribution system.

Second Embodiment

The embodiment related to the apparatus of the disclosure has hitherto been described. However, the present invention may be carried out in various different modes other than the above-mentioned embodiment. Hence, another embodiment included in the present invention is hereinafter described.

[Distribution and Integration]

Moreover, the illustrated components of each device are not necessarily needed to be configured physically as illustrated. In other words, specific modes of the distribution/integration of the devices are not limited to those illustrated. All or part of them can be configured by being distributed/integrated functionally or physically in any units in accordance with various loads and use states. For example, the retrieval unit 19a, the association unit 19b, the acquisition unit 19c, the calculation unit 19d, or the determination unit. 19e may be connected as an external device of the power distribution management apparatus 10 via a network. Moreover, the retrieval unit 19a, the association unit. 19b, the acquisition unit 19c, the calculation unit 19d, and the determination unit 19e may be respectively held by other devices, and connected to a network to cooperate. Accordingly, the above functions of the power distribution management apparatus 10 may be realized.

[Voltage Determination Program]

Moreover, the various processes described in the above embodiment can be realized by executing a program prepared in advance on a computer such as a personal computer or workstation. Hence, in the following description, a description is given of an example of a computer that executes a voltage determination program having similar functions to the above embodiment, with reference to FIG. 18.

Figure 18:
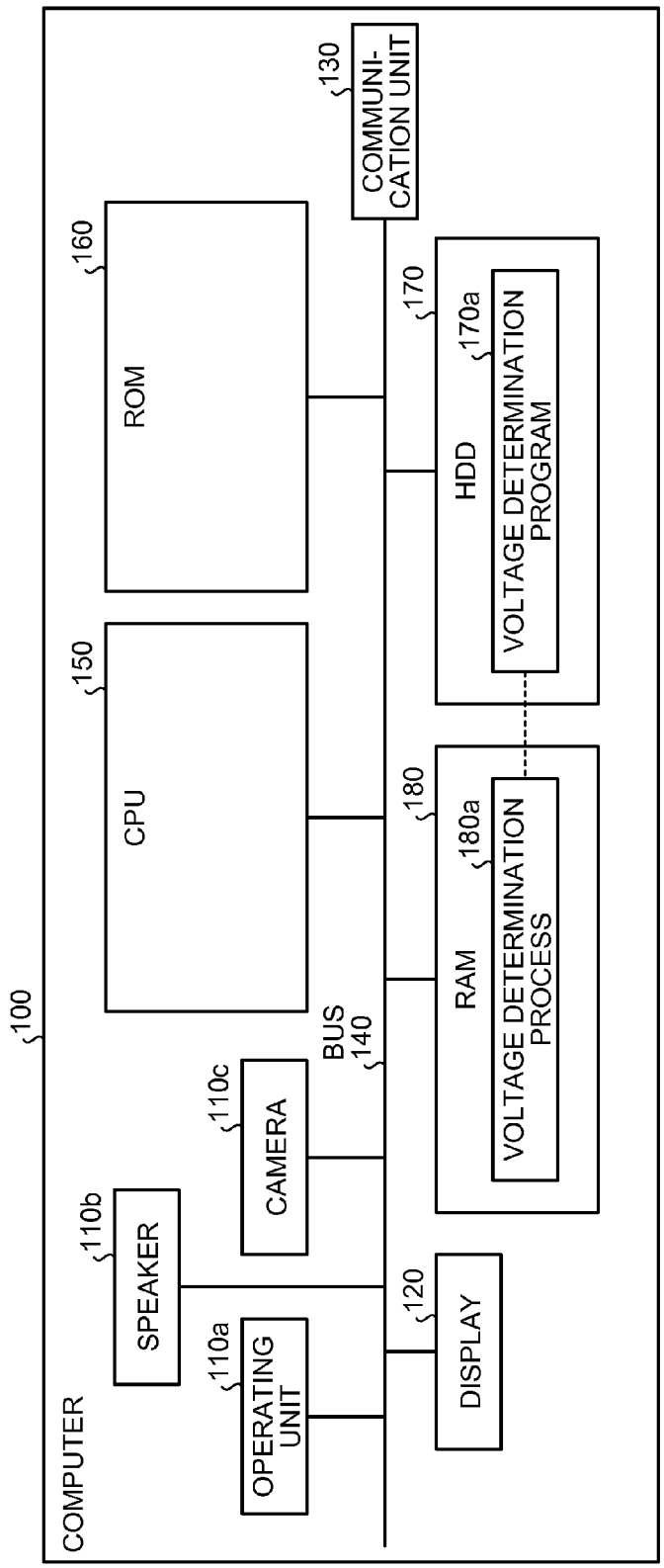
FIG. 18 is a diagram illustrating an example of a computer that executes a voltage determination program according to the first embodiment and a second embodiment.

FIG. 18 is a diagram illustrating an example of a computer that executes the voltage determination program according to the first and second embodiments. As illustrated in FIG. 18, a computer 100 includes an operating unit 110a, a speaker 110b, a camera 110c, a display 120, and a communication unit 130. Furthermore, the computer 100 includes a CPU 150, ROM 160, an HDD 170, and RAM 180. The units 110 to 180 are connected via a bus 140.

As illustrated in FIG. 18, a voltage determination program 170a that exhibits similar functions to the retrieval unit 19a, the association unit 19b, the acquisition unit 19c, the calculation unit 19d, and the determination unit 19e illustrated in the above first embodiment are stored in advance in the HDD 170. The voltage determination program 170a may be integrated or distributed as appropriate, as in the components of the retrieval unit 19a, the association unit 19b, the acquisition unit 19c, the calculation unit 19d, and the determination unit 19e illustrated in FIG. 1. In other words, not all data to be stored in the HDD 170 is needed to be always stored in the HDD 170. It is sufficient if only data for a process is stored in the HUD 170.

The CPU 150 then reads the voltage determination program 170a from the HUD 170 and develops it in the RAM 180. Consequently, the voltage determination program 170a functions as a voltage determination process 180a as illustrated in FIG. 18. The voltage determination process 180a develops various types of data read from the HUD 170 in an area assigned to itself on the PAM 180 as appropriate, and executes various processes based on the developed various types of data. The voltage determination process 180a includes the processes to be executed by the retrieval unit 19a, the association unit 19b, the acquisition unit. 19c, the calculation unit 19d, and the determination unit 19e illustrated in FIG. 1, for example, the processes illustrated in FIGS. 14 to 17. Moreover, not all the processing units to be virtually realized on the CPU 150 need to always operate on the CPU 150. Only a processing unit, for a process may be virtually realized.

The above voltage determination program 170a is not necessarily stored in the HOD 170 or the ROM 160 from the beginning. For example, programs are stored in "portable physical media" such as flexible disks, what is called FD, CD-ROMs, DVD disks, magneto-optical disks, and IC cards, which are inserted into the computer 100. The computer 100 may be configured to acquire and execute the programs from these portable physical media. Moreover, it may be configured such that the programs are stored in another computer, a server apparatus, or the like that is connected to the computer 100 via a public line, the Internet, a LAN, a WAN, or the like, and the computer 100 acquires and executes the programs therefrom.

According to one embodiment, it is possible to suppress the power beyond a tolerance range of voltage from flowing in a power distribution system.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope, of the invention.

What is claimed is:

1. A power distribution management apparatus comprising:
a processor that executes a process comprising:
acquiring the amount of demand obtained by forecasting the amount of power to be used by load equipment of a customer, and the amount of power generation obtained by forecasting the amount of power to be generated by power generation equipment of the customer;
setting a plurality of voltage values as a plurality of candidates for a transmission voltage from a substation of a power distribution system, and calculating a voltage at a connection point of the load equipment of the customer and equipment of the power distribution system at each of the plurality of candidates by utilizing a difference between the demand amount and the power generation amount of each customer; and
determining the transmission voltage of the substation from the plurality of candidates based on a result of the calculating, wherein
the determining includes selecting a candidate having a minimum number of transformers linked to load equipment of a customer whose calculated voltage deviates from a tolerance range of a predetermined standard voltage,
the determining includes selecting a candidate having a minimum number of pieces of the load equipment of customers whose calculated voltage deviates from a tolerance range of a predetermined standard voltage, and
the determining includes selecting a candidate having a minimum number of switch sections including load equipment of a customer whose calculated voltage deviates from a tolerance range of a predetermined standard voltage.

2. A voltage determination method comprising:
acquiring, using a processor, the amount of demand obtained by forecasting the amount of power to be used by load equipment of a customer, and the amount of power generation obtained by forecasting the amount of power to be generated by power generation equipment of the customer;
setting, using the processor, a plurality of voltage values as a plurality of candidates for a transmission voltage from a substation of a power distribution system, and calculating a voltage at a connection point of the load equipment of the customer and equipment of the power distribution system at each of the plurality of candidates by utilizing a difference between the demand amount and the power generation amount of each customer; and determining, using the processor, the transmission voltage of the substation from the plurality of candidates based on a result of the calculating, wherein the determining includes selecting a candidate having a minimum number of transformers linked to load equipment of a customer whose calculated voltage deviates from a tolerance range of a predetermined standard voltage, the determining includes selecting a candidate having a minimum number of pieces of the load equipment of customers whose calculated voltage deviates from a tolerance range of a predetermined standard voltage, and the determining includes selecting a candidate having a minimum number of switch sections including load equipment of a customer whose calculated voltage deviates from a tolerance range of a predetermined standard voltage.

3. A non-transitory computer readable recording medium having stored therein a voltage determination program that causes a computer to execute a process comprising:

acquiring the amount of demand obtained by forecasting the amount of power to be used by load equipment of a customer, and the amount of power generation obtained by forecasting the amount of power to be generated by power generation equipment of the customer;

setting a plurality of voltage values as a plurality of candidates for a transmission voltage from a substation of a power distribution system, and calculating a voltage at a connection point of the load equipment of the customer and equipment of the power distribution system at each of the plurality of candidates by utilizing a difference between the demand amount and the power generation amount of each customer; and determining the transmission voltage of the substation from the plurality of candidates based on a result of the calculating, wherein the determining includes selecting a candidate having a minimum number of transformers linked to the load equipment of the customer whose voltage deviating from a tolerance range of a predetermined standard voltage has been calculated, the determining includes selecting a candidate having a minimum number of pieces of the load equipment of customers whose calculated voltage deviates from a tolerance range of a predetermined standard voltage, and the determining includes selecting a candidate having a minimum number of switch sections including load equipment of a customer whose calculated voltage deviates from a tolerance range of a predetermined standard voltage.

\* \* \* \* \*